United States Patent
Suzuki et al.

(10) Patent No.: US 10,374,381 B2
(45) Date of Patent: Aug. 6, 2019

(54) EXTREME ULTRAVIOLET LIGHT GENERATING APPARATUS

(71) Applicant: Gigaphoton Inc., Tochigi (JP)

(72) Inventors: Toru Suzuki, Oyama (JP); Takashi Suganuma, Oyama (JP); Akihiro Takayama, Oyama (JP); Yoshiaki Kurosawa, Oyama (JP)

(73) Assignee: Gigaphoton Inc., Tochigi (JP)

( * ) Notice: Subject to any disclaimer, the term of this patent is extended or adjusted under 35 U.S.C. 154(b) by 115 days.

(21) Appl. No.: 15/590,238

(22) Filed: May 9, 2017

(65) Prior Publication Data

US 2017/0250517 A1    Aug. 31, 2017

Related U.S. Application Data

(63) Continuation of application No. PCT/JP2015/083075, filed on Nov. 25, 2015.

(30) Foreign Application Priority Data

Dec. 19, 2014  (WO) .................. PCT/JP2014/083661

(51) Int. Cl.
*H01S 3/10* (2006.01)
*H05G 2/00* (2006.01)
(Continued)

(52) U.S. Cl.
CPC ............ *H01S 3/10* (2013.01); *H01L 21/30* (2013.01); *H05G 2/00* (2013.01); *H05G 2/008* (2013.01); *H01S 3/00* (2013.01); *H01S 5/005* (2013.01)

(58) Field of Classification Search
CPC .. G02B 19/009; G02B 19/00; G02B 26/0825; G02B 17/061; H01S 3/10; H01S 3/00;
(Continued)

(56) References Cited

U.S. PATENT DOCUMENTS

| 4,812,613 A | 3/1989 | Gorisch |
| 2010/0078577 A1 | 4/2010 | Moriya et al. |

(Continued)

FOREIGN PATENT DOCUMENTS

| JP | S63-249813 A | 10/1988 |
| JP | 2010-135769 A | 6/2010 |

(Continued)

OTHER PUBLICATIONS

International Search Report issued in PCT/JP2015/083075; dated Feb. 23, 2016.

*Primary Examiner* — Jie Lei
(74) *Attorney, Agent, or Firm* — Studebaker & Brackett PC

(57) ABSTRACT

A beam adjusting apparatus of an extreme ultraviolet light generating apparatus may include: a first pair of mirrors constituted by a first concave mirror and a first convex mirror, provided along the optical path of the pulsed laser beam; a second pair of mirrors constituted by a second concave mirror and a second convex mirror, which are arranged in an order reversed from the order of arrangement of the first concave mirror and the first convex mirror, provided along the optical path of the pulsed laser beam downstream from the first pair of mirrors; and a moving apparatus configured to simultaneously increase or simultaneously decrease the distance between the first concave mirror and the first convex mirror and the distance between the second concave mirror and the second convex mirror.

11 Claims, 23 Drawing Sheets

(51) Int. Cl.
*H01L 21/30* (2006.01)
*H01S 3/00* (2006.01)
*H01S 5/00* (2006.01)

(58) Field of Classification Search
CPC  H01S 4/00; H01S 3/005; H01S 5/005; H05G 2/00; H05G 2/008; H01L 21/30
USPC .... 359/846, 849, 850, 853, 859, 333; 372/9, 372/5
See application file for complete search history.

(56) References Cited

U.S. PATENT DOCUMENTS

| | | |
|---|---|---|
| 2010/0117009 A1* | 5/2010 | Moriya .................. H01S 3/1305 250/504 R |
| 2010/0127191 A1 | 5/2010 | Partlo et al. |
| 2012/0085741 A1 | 4/2012 | Holverson et al. |
| 2012/0228525 A1 | 9/2012 | Moriya et al. |
| 2012/0319014 A1 | 12/2012 | Moriya et al. |
| 2013/0048886 A1 | 2/2013 | Moriya et al. |
| 2013/0148677 A1 | 6/2013 | Moriya et al. |
| 2013/0187065 A1 | 7/2013 | Moriya et al. |
| 2013/0208742 A1 | 8/2013 | Mizoguchi et al. |
| 2015/0334814 A1 | 11/2015 | Moriya et al. |

FOREIGN PATENT DOCUMENTS

| | | |
|---|---|---|
| JP | 2010-186735 A | 8/2010 |
| JP | 2012-160565 A | 8/2012 |
| JP | 2012-175006 A | 9/2012 |
| JP | 2012-199512 A | 10/2012 |
| JP | 2013-038204 A | 2/2013 |
| JP | 2013-165256 A | 8/2013 |

\* cited by examiner

COMPARATIVE EXAMPLE

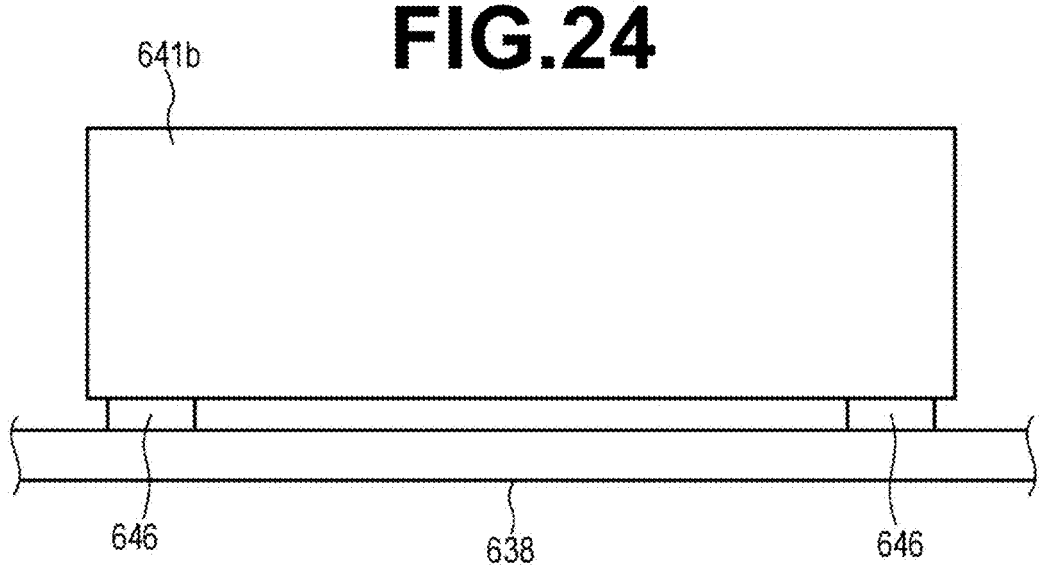

EXTREME ULTRAVIOLET LIGHT GENERATING APPARATUS

CROSS REFERENCE TO RELATED APPLICATIONS

The present application is a Continuation application of International Application No. PCT/JP2015/083075 filed on Nov. 25, 2015, which claims priority under 35 U.S.C. § 119(a) to International patent Application No. PCT/JP2014/083661 filed on Dec. 19, 2014. The content of these applications are incorporated herein by reference in their entireties.

BACKGROUND

1. Technical Field

The present disclosure is related to an extreme ultraviolet light generating apparatus.

2. Related Art

Recently, as semiconductor processes have become finer, transfer patterns for use in photolithography of semiconductor processes have also become finer. In the next generation, microfabrication at 70 nm to 45 nm, and further, microfabrication at 32 nm or less will be in demand. In order to meet this demand for microfabrication at 32 nm or less, there is expectation for development of an exposure apparatus in which an extreme ultraviolet (EUV) light generating apparatus that generates extreme ultraviolet (EUV) light having a wavelength of approximately 13 nm is combined with a reduced projection reflective optic system.

Three types of EUV light generating apparatuses have been proposed. The three types are: an LPP (Laser Produced Plasma) type apparatus that employs plasma which is generated by irradiating a laser beam onto a target substance; a DPP (Discharge Produced Plasma) type apparatus that employs plasma which is generated by electrical discharge, and an SR (Synchrotron Radiation) type apparatus that employs synchrotron orbital radiation.

RELATED ART DOCUMENTS

Patent Documents

[Patent Document 1]
  Japanese Unexamined Patent Publication No. 2010-135769
[Patent Document 2]
  Japanese Unexamined Patent Publication No. 2010-186735
[Patent Document 3]
  Japanese Unexamined Patent Publication No. 2012-175006
[Patent Document 4]
  US Published Patent Application No. 2010/0127191
[Patent Document 5]
  US Published Patent Application No. 2012/0085741

SUMMARY

An aspect of the present disclosure is an extreme ultraviolet light generating apparatus that irradiates a target with a pulsed laser beam output from a laser apparatus to generate plasma, thereby generating extreme ultraviolet light, which may include:
  a chamber;
  a target supply unit configured to output the target into the chamber; and
  a beam adjusting apparatus configured to adjust beam parameters, provided along the optical path of the pulsed laser beam which is irradiated onto the target;
  the beam adjusting apparatus comprising:
  a first pair of mirrors constituted by a first concave mirror and a first convex mirror, provided along the optical path of the pulsed laser beam;
  a second pair of mirrors constituted by a second concave mirror and a second convex mirror, which are arranged in an order reversed from the order of arrangement of the first concave mirror and the first convex mirror, provided along the optical path of the pulsed laser beam downstream from the first pair of mirrors; and
  a moving apparatus that simultaneously increases or simultaneously decreases the distance between the first concave mirror and the first convex mirror and the distance between the second concave mirror and the second convex mirror.

BRIEF DESCRIPTION OF THE DRAWINGS

Embodiments of the present disclosure will be described below as examples, with reference to the attached drawings.

FIG. 24 is a diagram of a protective cover as viewed from the direction of arrow E illustrated in FIG. 23.

DETAILED DESCRIPTION OF THE PREFERRED EMBODIMENTS

Figure 1:
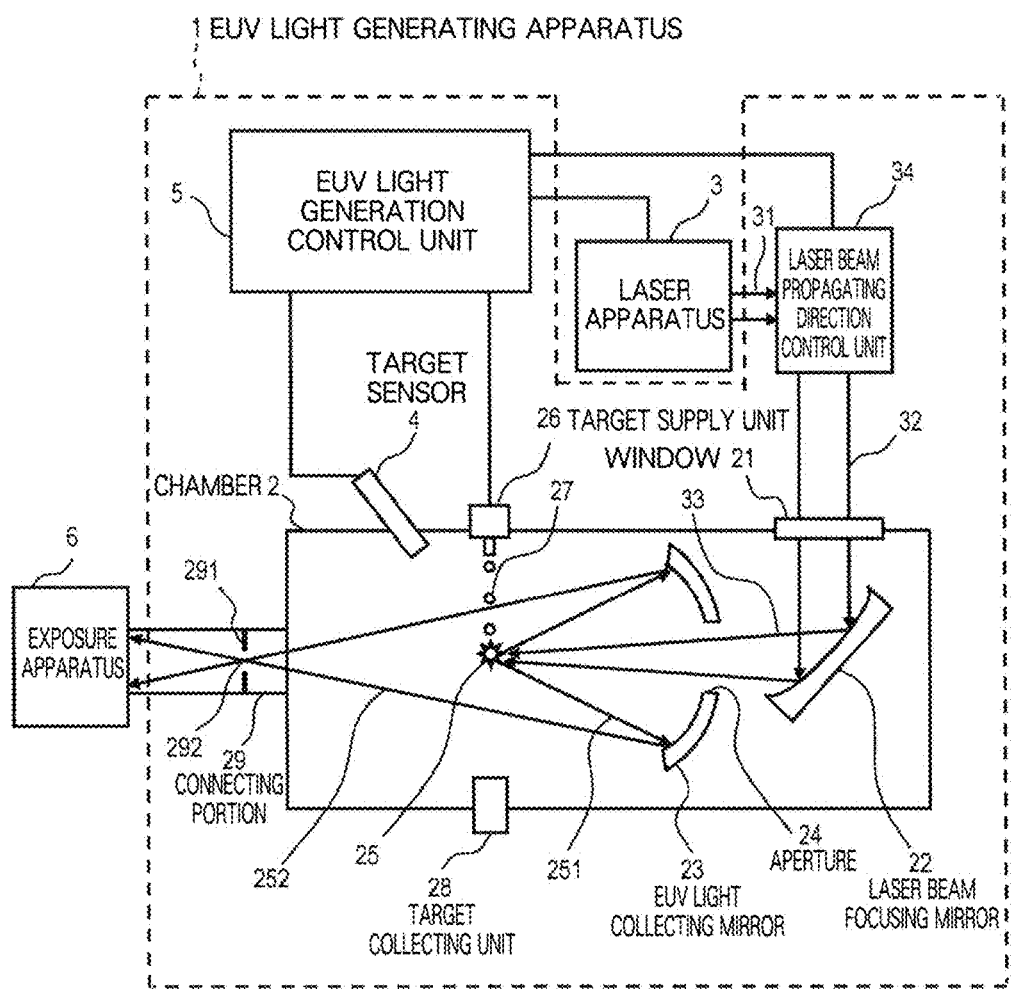
FIG. 1 is a diagram that schematically illustrates the configuration of an exemplary EUV light generating system of the LPP type.

—Contents—
1. Overview
2. Overview of EUV Light Generating System
   Configuration
   Operation
3. Comparative Example for EUV Light Generating System
   Configuration
   Operation
   Configuration of Beam Adjusting Apparatus
   Operation of Beam Adjusting Apparatus
4. First Embodiment
   Configuration
   Operation
   Effects
   Modification
5. Second Embodiment
   Configuration
   Operation
6. Third Embodiment
   Configuration
   Operation
7. Fourth Embodiment
   Configuration
   Operation
   Effects
8. Fifth Embodiment
   Configuration
   Operation
9. Sixth Embodiment
   Configuration
   Operation and Effects
   Modification
10. Seventh Embodiment
    Configuration
    Operation and Effects
    Modifications Embodiments of the present disclosure will be described in detail hereunder with reference to the attached drawings. The embodiments to be described below are illustrative examples of the present disclosure, and do not limit the scope of the present disclosure. In addition, not all of the configurations and operations of the embodiments to be described below are necessarily essential configurations and operations of the present disclosure. Note that common constituent elements will be denoted with the same reference numbers, and redundant descriptions will be omitted.

1. Overview

An EUV light generating apparatus of the LPP type generates EUV light, by irradiating a pulsed laser beam, which is output from a laser apparatus, onto a target, which is output from a target supply unit, and turning the target into plasma.

The pulsed laser beam which is output from the laser apparatus may be irradiated onto the target via a beam adjusting apparatus and a laser collecting optical system. The diverging angle of the pulsed laser beam may be adjusted by the beam adjusting apparatus in order to adjust the energy density of the pulsed laser beam which is irradiated onto the target.

If the diverging angle of a pulsed laser beam is adjusted by a conventional beam adjusting apparatus, there are cases in which the beam diameter and the output direction of the pulsed laser beam would change. If the beam diameter and the output direction change, the pulsed laser beam that enters a laser collecting optical system will not meet the laser entry conditions of the laser collecting optical system. Thereby, the pulsed laser beam may be shielded by elements, resulting in a decrease in the amount of irradiated energy, or optical elements may be damaged due to the pulsed laser beam being collected.

A beam adjusting apparatus of an example of the present disclosure may include a first pair of mirrors constituted by a first concave mirror and a first convex mirror, and a second pair of mirrors constituted by a second concave mirror and a second convex mirror, provided downstream from the first pair of mirrors. The order of arrangement of the second concave mirror and the second convex mirror may be reversed from the order of arrangement of the first concave mirror and the first convex mirror. The beam adjusting apparatus may change the distance between the first concave mirror and the first convex mirror and the distance between the second concave mirror and the second convex mirror such that these distances simultaneously increase or simultaneously decrease.

The beam adjusting apparatus described above can decrease changes in the beam diameter and output direction when adjusting the diverging angle of a pulsed laser beam, and enables irradiation conditions of the pulsed laser beam onto a target to be maintained.

2. Overview of EUV Light Generating System

<Configuration>

FIG. 1 is a diagram that schematically illustrates the configuration of an exemplary EUV light generating system of the LPP type. An EUV light generating apparatus 1 may be employed with at least one laser apparatus 3 (a system that includes the EUV light generating apparatus 1 and the laser apparatus 3 may be referred to as an EUV light generating system 11). As illustrated in FIG. 1 and as will be described in detail later, the EUV light generating apparatus 1 may include a chamber 2 and a target supply unit 26 (a droplet generator, for example). The chamber 2 may be capable of being sealed to be gastight. The target supply unit 26 may be mounted on a wall of the chamber 2, for example. The material which is supplied by the target supply unit 26 as a target may include, but is not limited to, tin, terbium, gadolinium, lithium, xenon, or any combination including two or more thereof.

A wall of the chamber 2 may have at least one aperture penetrating therethrough. A pulsed laser beam 32 which is output from the laser apparatus 3 may pass through the aperture. At least one window 21, through which the pulsed laser beam 32 which is output from the laser apparatus is transmitted, may be provided in the chamber 2. An EUV light collecting mirror 23 having a spheroidal reflective surface may be provided in the chamber 2, for example. The EUV light collecting mirror 23 has a first focal point and a second focal point. The surface of the EUV light collecting mirror 23 may have a multi layered reflective film, in which molybdenum layers and silicon layers are alternately laminated, formed thereon, for example. It is preferable for the EUV light collecting mirror 23 to be provided such that the first focal point is positioned at a plasma generating position (plasma generation region 25) or the vicinity thereof, and the second focal point is positioned at a desired focal point (intermediate focal point (IF) 292) which is defined by the specifications of an exposure apparatus, for example. The EUV light collecting mirror 23 may have an aperture 24 formed in the center thereof, through which a pulsed laser beam 33 may pass.

The EUV light generating apparatus 1 may include an EUV light generation control unit 5. In addition, the EUV light generating apparatus 1 may include a target sensor 4. The target sensor 4 may detect at least one of the presence, the trajectory, and the position of a target 27. The target sensor 4 may have an image capturing function.

Further, the EUV light generating apparatus 1 may include a connecting portion 29 that enables the interior of the chamber 2 to be in communication with the interior of an exposure apparatus 6. A wall 291 having an aperture formed therethrough may be provided in the connecting portion 29. The wall 291 may be provided such that the aperture is positioned at the second focal point of the EUV light collecting mirror 23.

The EUV light generating apparatus 1 may additionally include a laser beam propagating direction control unit 34, a laser beam collecting mirror 22, a target collecting unit 28 configured to collect the target 27, and the like. The laser beam propagating direction controlling unit 34 may be equipped with an optical element for regulating the propagating direction of a laser beam, and an actuator for adjusting the position, orientation, etc. of the optical element.

<Operation>

Referring to FIG. 1, the pulsed laser beam 31 which is output from the laser apparatus 3 propagates via the laser beam propagating direction control unit 34, is transmitted through the window 21 as a pulsed laser beam 32, and then enters the chamber 2. The pulsed laser beam 32 may propagate through the chamber 2 along at least one laser beam path, be reflected by the laser beam collecting mirror 22, and be irradiated onto at least one target 27 as the pulsed laser beam 33.

The target supply unit 26 may be configured to output the target 27 toward the plasma generation region 25 in the interior of the chamber 2. At least one pulse which is included in the pulsed laser beam 33 may be irradiated onto the target 27. The target 27 which is irradiated by the pulsed laser beam turns into plasma, and EUV light 251 is generated from the plasma. The EUV light 251 may be reflected and collected by the EUV light collecting mirror 23. EUV light 252 which is reflected by the EUV light collecting mirror 23 may pass through the intermediate focal point 292 and output to the exposure apparatus 6. Note that a plurality of pulses which are included in the pulsed laser beam 33 may be irradiated onto a single target 27.

The EUV light generation control unit 5 may be configured to totally control the entire EUV light generating system 11. The EUV light generation control unit 5 may be configured to process image data of the target 27 captured by the target sensor 4 or the like. The EUV light generation control unit 5 may control at least one of the timing at which the target 27 is output and the output direction of the target 27, for example. The EUV light generation control unit 5 may control at least one of the laser oscillation timing of the laser apparatus 3, the propagating direction of the pulsed laser beam 32, and the focal position of the pulsed laser beam 33, for example. The above items which are controlled are merely examples, and other additional items may be controlled as necessary.

3. Comparative Example for EUV Light Generating System

<Configuration>

Figure 2:
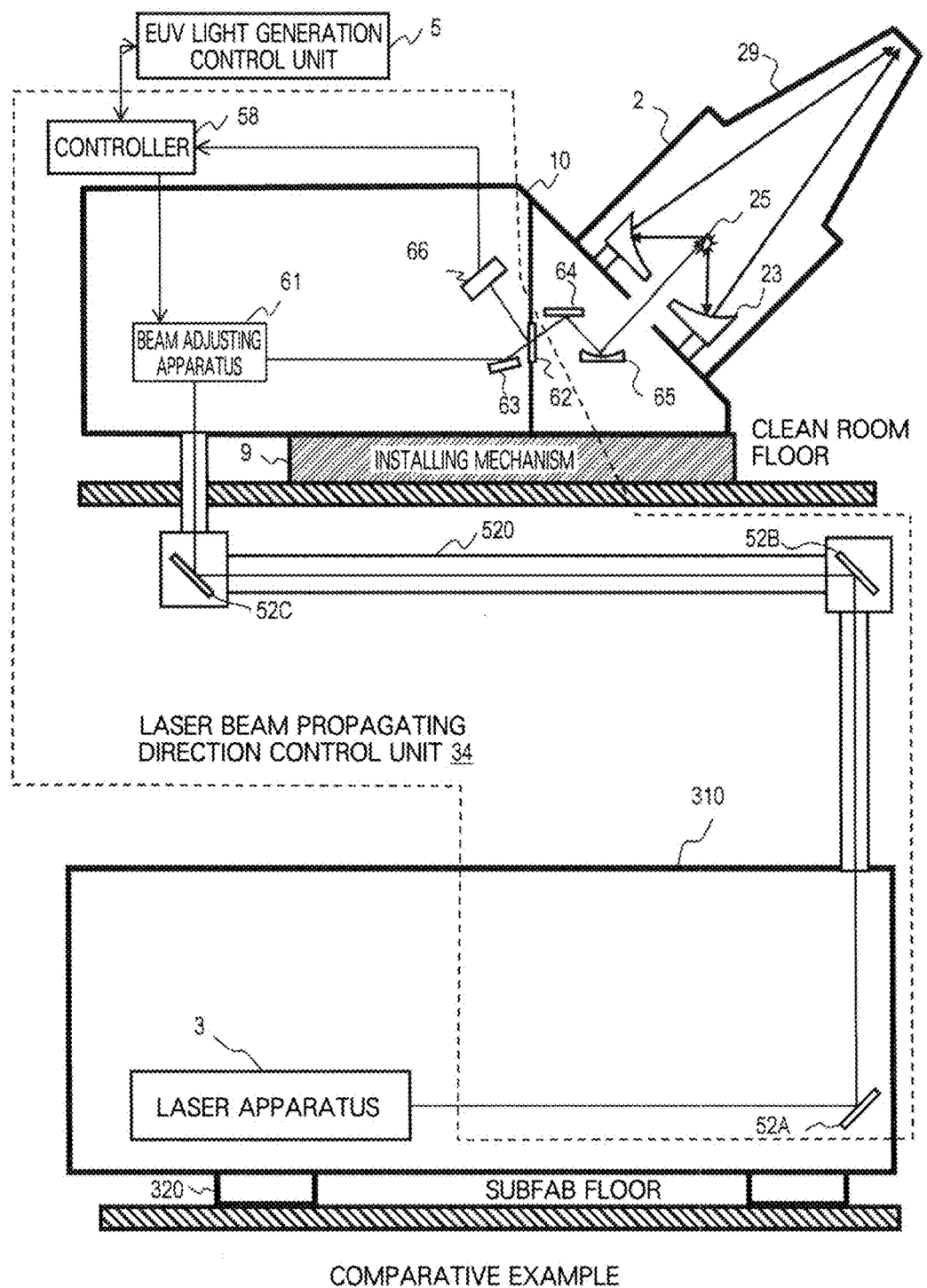
FIG. 2 is a partial sectional diagram that illustrates the configuration of an EUV light generating apparatus according to a comparative example.

FIG. 2 is a partial sectional diagram that illustrates the configuration of an EUV light generating system according to a comparative example. A chamber 2 may be placed on a clean room floor, and a laser apparatus 3 may be placed on a subfab floor. The subfab floor may be positioned at a lower level than the clean room floor. The laser apparatus 3 may be a $CO_2$ laser apparatus that outputs a pulsed laser beam.

A laser beam propagating direction control unit 34 for controlling the propagating direction of a laser beam which is supplied into the chamber 2 from the laser apparatus 3 may be provided to straddle the clean room floor and the subfab floor.

The laser apparatus 3 may be fixed within a casing 310 by a fixing device, which is not illustrated. The casing 310 may be installed on the subfab floor by an air suspension 320. The laser beam propagating direction control unit 34 may include a high reflectance mirror 52A at the subfab floor. The high reflectance mirror 52A may be provided along the optical path of the pulsed laser beam which is output by the laser apparatus 3. The high reflectance mirror 52A may reflect the pulsed laser beam toward a light pipe 520.

The laser beam propagating direction control unit 34 may guide the pulsed laser beam which is reflected by the high reflectance mirror 52A at the subfab floor to the clean room floor. The laser beam propagating direction control unit 34 may include the hollow light pipe 520 in a region that straddles the subfab floor and the clean room floor. A plurality of high reflectance mirrors 52B and 52C may be provided within the light pipe 520. The plurality of high reflectance mirrors 52B and 52C may constitute a transmission path that guide the pulsed laser beam from the laser apparatus 3 to the chamber 2.

The chamber 2 may be fixed on a chamber reference member 10 at the clean room floor. The chamber reference member 10 may be fixed on the clean room floor by an installing mechanism 9. The chamber reference member 10 may house a group of optical elements that constitute a portion of the laser bean propagating direction control unit 34.

The laser beam propagating direction control unit 34 may include a beam adjusting apparatus 61, a beam monitor 66, a controller 58, a high reflectance mirror 63, and a window 62 at the clean room floor. The beam adjusting apparatus 61, the beam monitor 66, the high reflectance mirror 63, and the window 62 may be provided within the chamber reference member 10.

Light which is reflected by the high reflectance mirror 52C may enter the beam adjusting apparatus 61. The beam adjusting apparatus 61 may be configured to adjust the beam parameters of a pulsed laser beam. The beam adjusting apparatus 61 may include at least one mirror or at least one lens.

The high reflectance mirror 63 may be provided along the optical path of the pulsed laser beam between the beam adjusting apparatus 61 and the window 62. The high reflectance mirror 63 may reflect the pulsed laser beam from the beam adjusting apparatus 61 toward the window 62 and a planar mirror 64.

The window 62 may reflect a portion of the pulsed laser beam reflected thereto by the high reflectance mirror 63 and transmit the remaining portion of the pulsed laser beam. The beam monitor 66 may be configured to measure the beam parameters of the slight amount of the pulsed laser beam which is reflected at the window 62. The beam monitor 66 may be configured to output detected values for calculating parameters related to the profile of sample light at a light receiving surface to the controller 58. The parameters may be a beam diameter and a beam center, for example.

The controller 58 may be connected to the beam adjusting apparatus 61, the beam monitor 66, and the EUV light generation control unit 5. The controller 58 may calculate the values of parameters related to the profile of sample light, based on the detected values output from the beam monitor 66.

The controller 58 may utilize the parameter values to exert feedback control on the beam adjusting apparatus 61 such that sample light having a profile within a range which is determined in advance enters the light receiving surface of the beam monitor 66.

<Operation>

The laser apparatus 3 may output a pulsed laser beam. The optical path of the pulsed laser beam may reach the beam adjusting apparatus 61 via the high reflectance mirrors 52A through 52C. The pulsed laser beam which has been adjusted by the beam adjusting apparatus 61 may be reflected by the high reflectance mirror 63.

The pulsed laser beam which is reflected by the high reflectance mirror 63 may be transmitted through the window 62 and then enter the planar mirror 64. The window 62 may reflect a portion of the pulsed laser beam to the beam monitor 66.

The beam monitor 66 may output detected values related to the pulsed laser beam. The detected values may be input to the controller 58. The controller 58 may calculate parameters from the detected values, and control the beam adjusting apparatus 61 such that the parameters become desired values. The controller 58 may control the diverging angle of the pulsed laser beam using the beam adjusting apparatus 61 such that the beam diameter becomes a predetermined size, for example.

The pulsed laser beam of the predetermined diverging angle may be reflected by the planar mirror 64 and a laser beam focusing mirror 65, and then be focused on a target 27 which is supplied to the plasma generating region 25. The target 27 turns into plasma by being irradiated by the pulsed laser beam, and radiant light that includes EUV is emitted from the plasma.

<Configuration of the Beam Adjusting Apparatus>

Figure 3:
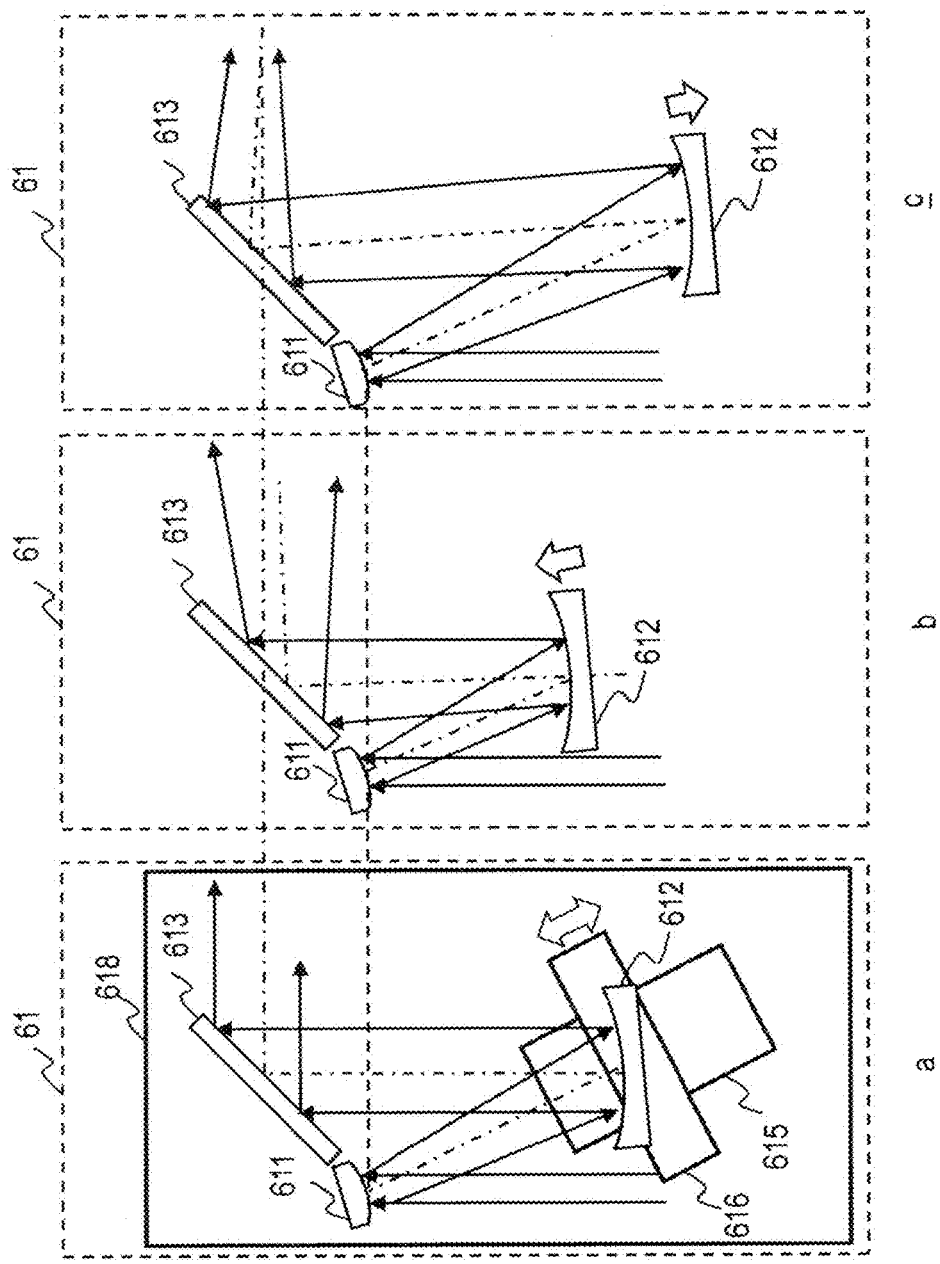
FIG. 3 is a diagram that illustrates the configuration and operation of a beam adjusting apparatus of the comparative example.

FIG. 3 is a diagram that illustrates the configuration of the beam adjusting apparatus 61 of the comparative example. As illustrated in part a of FIG. 3, the beam adjusting apparatus 61 may include an off axis parabolic convex mirror 611, an off axis parabolic concave mirror 612, a planar mirror 613, and a uniaxial movement stage 615. The uniaxial movement stage 615 may include a movable plate 616 which is capable of moving on the uniaxial movement stage 615 in a uniaxial direction. The movable plate 616 may move along the direction of the optical axis of light which is input to the off axis parabolic concave mirror 612.

The off axis parabolic convex mirror 611, the planar mirror 613, and the uniaxial movement stage 615 may be fixed on a base plate 618. The off axis parabolic concave mirror 612 may be fixed on the movable plate 616.

<Operation of the Beam Adjusting Apparatus>

The controller 58 is capable of adjusting the position of the off axis parabolic concave mirror 612 in the direction of an incident optical axis, by moving the movable plate 616. Part b of FIG. 3 illustrates a state in which the movable plate 616 is caused to approach the off axis parabolic convex mirror 611 from the state of the beam adjusting apparatus illustrated in part a of FIG. 3. As illustrated in part b, if the controller 58 causes the off axis parabolic concave mirror 612 to approach the off axis parabolic convex mirror 611, the diverging angle of the pulsed laser beam which is output from the beam adjusting apparatus 61 will become greater. At the same time however, the direction of the optical axis and the beam diameter of the pulsed laser beam which is output from the beam adjusting apparatus 61 will also change.

In addition, part c of FIG. 3 illustrates a state in which the movable plate 616 is at a greater distance from the off axis parabolic convex mirror 611 than the state of the beam adjusting apparatus illustrated in part a of FIG. 3. As illustrated in part c, if the controller 58 causes the off axis parabolic concave mirror 612 to move away from the off axis parabolic convex mirror 611, the diverging angle of the pulsed laser beam which is output from the beam adjusting apparatus 61 will become smaller. At the same time however, the direction of the optical axis and the beam diameter of the pulsed laser beam which is output from the beam adjusting apparatus 61 will also change.

<Problems>

As described above, in the beam adjusting apparatus 61 of the comparative example, the direction of the optical axis and the beam diameter of the pulsed laser beam which is output from the beam adjusting apparatus 61 change to a great degree, accompanying control of the diverging angle of the pulsed laser beam. For this reason, adjustment of irradiation conditions will become complex.

The controller 58 may control the orientation of the high reflectance mirror 63 to adjust the incident optical axis upon entry into the planar mirror 64, in order to correct for the change in the direction of the optical axis. However, the beam adjusting apparatus 61 of the comparative example is not capable of correcting the change in beam diameter. For this reason, in the case that the beam diameter increases, the beam adjusting apparatus 61 will cause a decrease in the amount of light to be generated due to vignetting at optical elements downstream from the beam adjusting apparatus 61. In the case that the beam diameter decreases, the beam adjusting apparatus 61 will cause damage to optical elements due to an increase in energy density.

4. First Embodiment

<Configuration>

Figure 4:
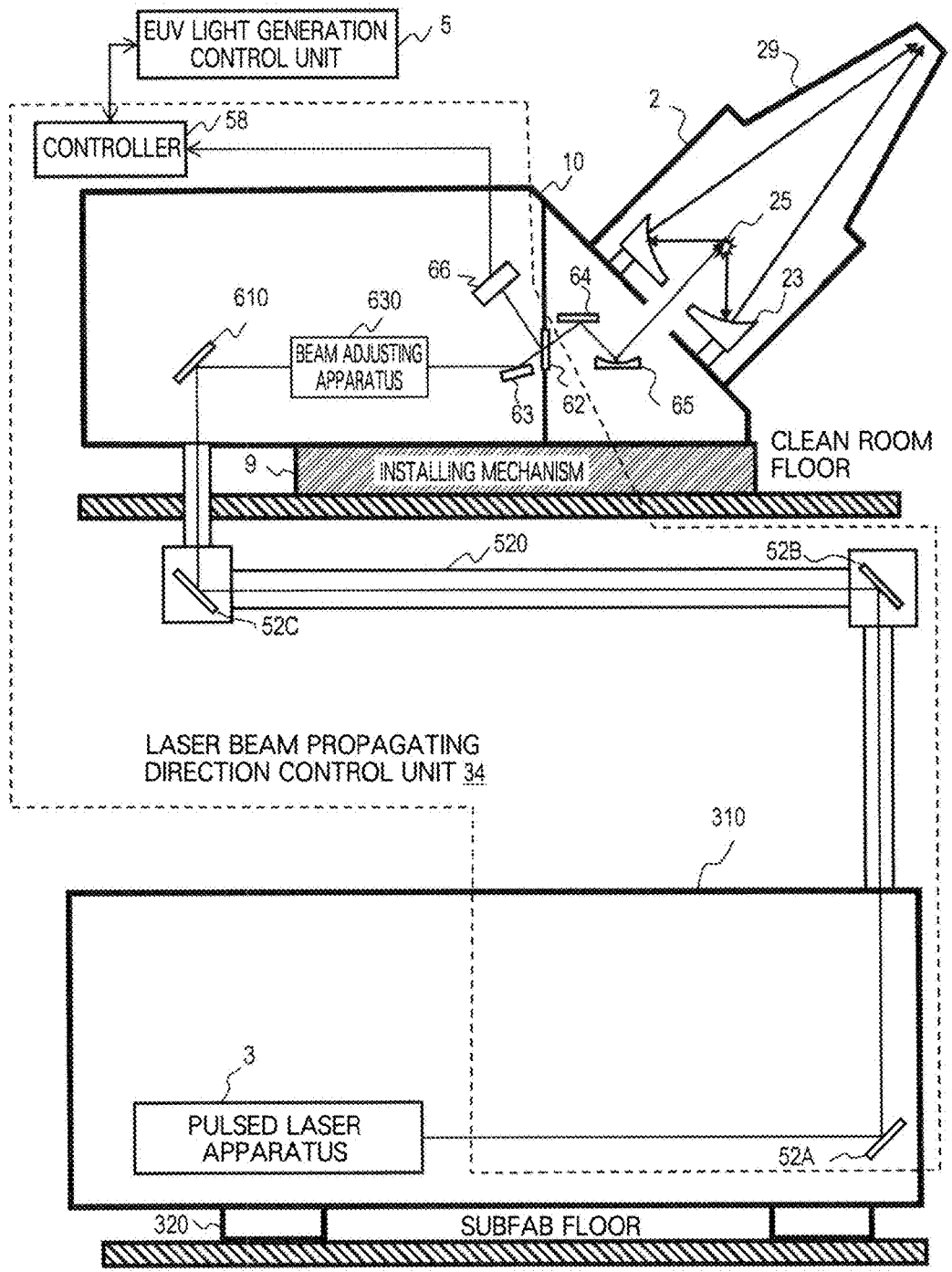
FIG. 4 is a diagram that illustrates an example of the configuration of an EUV light generating system of a first embodiment.

FIG. 4 is a diagram that illustrates an example of the configuration of an EUV light generating system 11 according to a first embodiment. Hereinafter, descriptions will be mainly given with respect to points of difference from the comparative example illustrated in FIG. 2. A laser beam propagating direction control unit 34 may include a beam adjusting apparatus 630 instead of the beam adjusting apparatus 61 of the comparative example illustrated in FIG. 2 at the clean room floor.

The laser propagating direction control unit 34 may further include a high reflectance mirror 610 along the optical path of a pulsed laser beam between a high reflectance mirror 52C and the beam adjusting apparatus 630. The high reflectance mirror 610 may reflect the pulsed laser beam reflected by the high reflectance mirror 52C toward the beam adjusting apparatus 630.

Figure 5A:
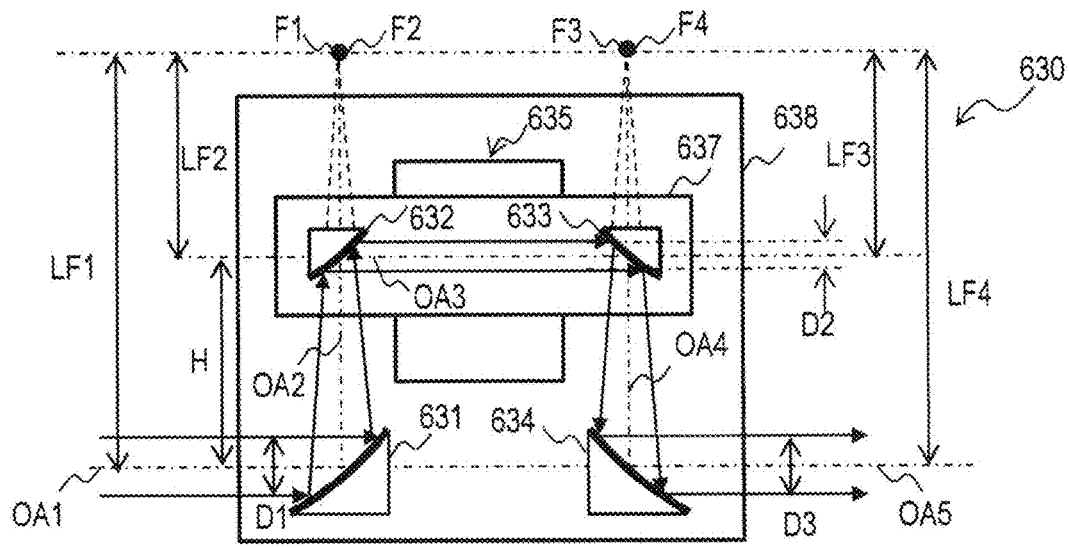
FIG. 5A is a diagram that illustrates an example of the configuration of a beam adjusting apparatus of the first embodiment.

FIG. 5A is a diagram that illustrates an example of the configuration of the beam adjusting apparatus 630 of the present embodiment. The beam adjusting apparatus 630 may include two off axis parabolic concave mirrors 631 and 634, and two off axis parabolic convex mirrors 632 and 633. The off axis parabolic concave mirror 631, the off axis parabolic convex mirror 632, the off axis parabolic convex mirror 633, and the off axis parabolic concave mirror 634 may be provided in this order along the optical path of the pulsed laser beam.

The off axis parabolic concave mirror 631 and the off axis parabolic convex mirror 632 may constitute an upstream side pair of mirrors, and the off axis parabolic convex mirror 633 and the off axis parabolic concave mirror 634 may constitute a downstream side pair of mirrors. The order of arrangement of the off axis parabolic concave mirrors and the off axis parabolic convex mirrors may be reversed from each other within the upstream side pair of mirrors and the downstream side pair of mirrors. Here, the upstream side may be a side closer to the light source of the pulsed laser beam along the optical path of the pulsed laser beam. In the first through third and fifth through seventh embodiments, the upstream side may be the side closer to a laser apparatus 3 along the optical path of the pulsed laser beam. In the fourth embodiment, the upstream side may be the side closer to an oscillator (MO) 301 along the optical path of the pulsed laser beam. In addition, the downstream side may be a side closer to a plasma generating region 25 along the optical path of the pulsed laser beam.

The beam adjusting apparatus 630 may be configured such that a focal point F1 of the off axis parabolic concave mirror 631 and a focal point F2 of the off axis parabolic convex mirror 632 are matched in the state illustrated in FIG. 5A. Further, the beam adjusting apparatus 630 may be configured such that a focal point F3 of the off axis parabolic convex mirror 633 and a focal point F4 of the off axis parabolic concave mirror 634 are matched. If the upstream side pair of mirrors and the downstream side pair of mirrors are arranged such that the focal points within each pair are matched, in the case that a puled laser beam that enters the beam adjusting apparatus 630 is a collimated beam, the pulsed laser beam which is output from the beam adjusting apparatus 630 will be a collimated beam.

The off axis parabolic concave mirrors 631 and 634 may have reflective curved surfaces which are of shapes represented by the same function. That is, the functions that define the shapes of the reflective surfaces of the off axis parabolic concave mirrors 631 and 634 may be the same. The off axis parabolic convex mirrors 632 and 633 may have reflective curved surfaces which are of shapes represented by the same function. That is, the functions that define the shapes of the reflective surfaces of the off axis parabolic convex mirrors 632 and 633 may be the same.

The off axis parabolic concave mirrors 631 and 634 and the off axis parabolic convex mirrors 632 and 633 may be arranged such that an optical axis OA2 between the off axis parabolic concave mirror 631 and the off axis parabolic convex mirror 632 and an optical axis OA4 between the off axis parabolic convex mirror 633 and the off axis parabolic concave mirror 634 are parallel.

The off axis parabolic concave mirrors 631 and 634 and the off axis parabolic convex mirrors 632 and 633 may be arranged such that an optical axis OA1 of the pulsed laser beam that enters the off axis parabolic concave mirror 631 and an optical axis OA5 of the pulsed laser beam which is output from the off axis parabolic concave mirror 634 are parallel.

The off axis parabolic concave mirrors 631 and 634 and the off axis parabolic convex mirrors 632 and 633 may be arranged such that an optical axis OA3 between the off axis parabolic convex mirror 632 and the off axis parabolic convex mirror 633, the optical axis OA1 of the pulsed laser beam that enters the off axis parabolic concave mirror 631, and the optical axis OA5 of the pulsed laser beam which is output from the off axis parabolic concave mirror 634 are parallel.

The angle formed by the optical axis OA1 of the pulsed laser beam that enters the off axis parabolic concave mirror 631 and the optical axis OA2 between the off axis parabolic concave mirror 631 and the off axis parabolic convex mirror 632 may be 90 degrees. That is, the incident angles and the reflection angles of the off axis parabolic concave mirrors 631 and 634 and the off axis parabolic convex mirrors 632 and 633 may be 45 degrees. The incident angles and the reflection angles of mirrors are defined between an incident optical axis and an output optical axis, and is half the angle between the incident optical axis and the output optical axis.

The distance between the off axis parabolic convex mirror 632 and the off axis parabolic concave mirror 631 may be the same as the distance between the off axis parabolic convex mirror 633 and the off axis parabolic concave mirror 634. These distances are denoted by H. The distance H between the off axis parabolic convex mirror 632 and the off axis parabolic concave mirror 631 may be the distance between a point at which the reflective surface of the off axis parabolic concave mirror 631 intersects with the optical axis OA2 and a point at which the reflective surface of the off axis parabolic convex mirror 632 intersects with the optical axis OA2. The distance H between the off axis parabolic convex mirror 633 and the off axis parabolic concave mirror 634 may be the distance between a point at which the reflective surface of the off axis parabolic convex mirror 633 intersects with the optical axis OA4 and a point at which the reflective surface of the off axis parabolic concave mirror 634 intersects with the optical axis OA4.

The beam adjusting apparatus 630 may further include a base plate 638 and a uniaxial movement stage 635. The uniaxial movement stage 635 may include a movable plate 637 which is capable of moving in a uniaxial direction on the uniaxial movement stage 635. The uniaxial movement stage 635 is a moving apparatus configured to move a mirror on the movable plate 637.

The uniaxial movement stage 635 may be provided on the base plate 638, and may be configured to move the movable plate 637 with respect to the base plate 638. The direction of movement of the movable plate 637 may be parallel to the optical axis OA2 between the off axis parabolic concave mirror 631 and the off axis parabolic convex mirror 632 and to the optical axis OA4 between the off axis parabolic convex mirror 633 and the off axis parabolic concave mirror 634.

The off axis parabolic concave mirrors 631 and 634 may be fixed on the base plate 638. The off axis parabolic convex mirrors 632 and 633 may be fixed on the movable plate 637. The uniaxial movement stage 635 is capable of changing the distance between the off axis parabolic convex mirror 632 and the off axis parabolic concave mirror 631 and the distance between the off axis parabolic convex mirror 633 and the off axis parabolic concave mirror 634 such that they simultaneously increase or simultaneously decrease.

Specifically, the distance H between the off axis parabolic convex mirror 632 and the off axis parabolic concave mirror 631 and the distance H between the off axis parabolic convex mirror 633 and the off axis parabolic concave mirror 634 simultaneously increase or simultaneously decrease accompanying movement of the movable plate 637.

<Operation>

Figure 5B:
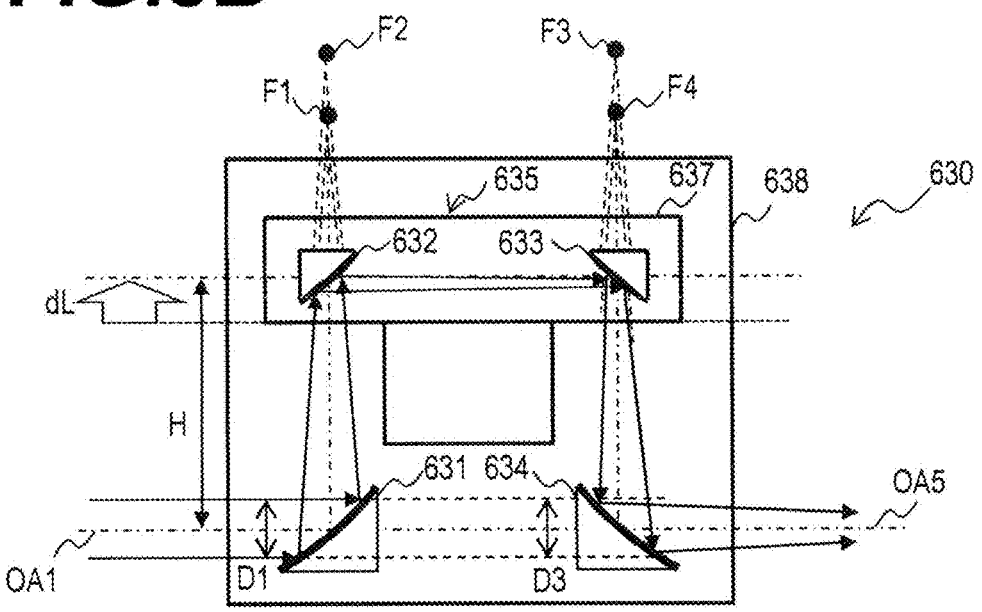
FIG. 5B is a diagram that illustrates a state in which a movable plate of the beam adjusting apparatus is separated from an off axis parabolic concave mirror from the state illustrated in FIG. 5A.
Figure 5C:
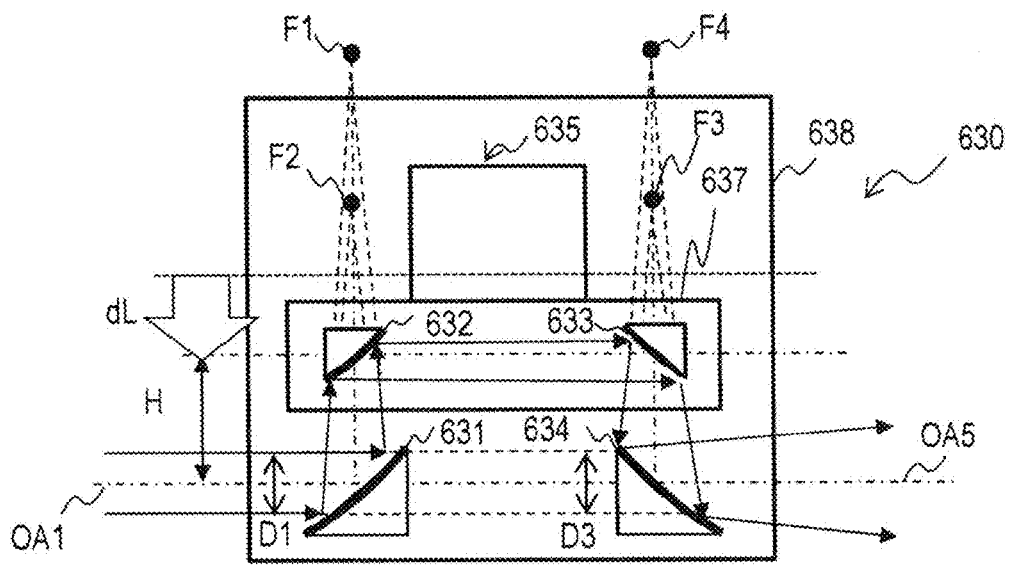
FIG. 5C is a diagram that illustrates a state in which the movable plate of the beam adjusting apparatus is caused to approach the off axis parabolic concave mirror from the state illustrated in FIG. 5A.

The operation of the beam adjusting apparatus 630 will be described with reference to FIG. 5A through FIG. 5C. FIG. 5B is a diagram that illustrates a state in which the movable plate 637 of the beam adjusting apparatus 630 is at a greater distance from the off axis parabolic concave mirrors 631 and 634 than the state illustrated in FIG. 5A. FIG. 5C is a diagram that illustrates a state in which the movable plate 637 of the beam adjusting apparatus 630 is caused to approach the off axis parabolic concave mirrors 631 and 634 from the state illustrated in FIG. 5A.

In FIG. 5A, the pulsed laser beam that enters the off axis parabolic concave mirror 631 may be a collimated beam. The off axis parabolic concave mirror 631 may reflect the pulsed laser beam such that it is focused at the focal point F1.

As described above, the focal point F1 may match the focal point F2 of the off axis parabolic convex mirror 632. Accordingly, the off axis parabolic convex mirror 632 can convert and reflect the pulsed laser beam, which is reflected by the off axis parabolic concave mirror 631 and propagates such that it is focused at the focal point F1, as a collimated beam. The beam diameter D2 of the pulsed laser beam which is converted into a collimated beam by the off axis parabolic convex mirror 632 is reduced to 1/M12 of an incident beam diameter D1.

The focal length of the off axis parabolic concave mirror 631 is designated as LF1, and the focal length of the off axis parabolic convex mirror 632 is designated as LF2. As described above, the focal point F1 and the focal point F2 may be matched. A magnification ratio M12 may be LF1/LF2. In addition, the distance H between the off axis parabolic concave mirror 631 and the off axis parabolic convex mirror 632 may be LF2-LF1.

The pulsed laser beam which has become a collimated beam having a beam diameter of D2 is reflected by the off axis parabolic convex mirror 633 as a pulsed laser beam that diverges from the focal point F3. As described above, the focal point F3 may match the focal point F4. Accordingly, the off axis parabolic concave mirror 634 can convert and reflect the pulsed laser beam that diverges from the focal point F3 into a collimated beam having the optical axis OA5, which is substantially the same as that of the pulsed laser beam that entered the off axis parabolic concave mirror 631.

The beam diameter of the pulsed laser beam which is reflected by the off axis parabolic convex mirror 633 and enters the off axis parabolic concave mirror 634 is magnified by a magnification ratio of M43. The focal length of the off axis parabolic convex mirror 633 is designated as LF3, and the focal length of the off axis parabolic concave mirror 634 is designated as LF4. As described above, the focal point F3 and the focal point F4 may be matched.

M43 may be LF4/LF3. In the case that LF1=LF4 and LF2=LF3, the magnification ratio M12 and the magnification ratio M43 will be the same. Accordingly, a beam diameter D3 of the light which is output from the off axis parabolic concave mirror 634 is equal to the beam diameter D1 of the pulsed laser beam that enters the off axis parabolic concave mirror 631.

The uniaxial movement stage 635 may move the movable plate 637 with respect to the base plate 638 under control of the controller 58. By moving the movable plate 637, the controller 58 is capable of increasing and decreasing the distance H between the off axis parabolic concave mirror 631 and the off axis parabolic convex mirror 632. The distance H may be the distance between a point at which the reflective surface of the off axis parabolic concave mirror 631 intersects with the optical axis OA2 and a point at which the reflective surface of the off axis parabolic convex mirror 632 intersects with the optical axis OA2. The distance between the off axis parabolic concave mirror 634 and the off axis parabolic convex mirror 633 may also be H. By changing the distance H, the controller 58 is capable of converging or diverging the light which is output from the beam adjusting apparatus 630.

For example, as illustrated in FIG. 5B, the controller 58 may increase the distance H by dL from the state illustrated in FIG. 5A. The diverging angle of the pulsed laser beam which is output from the off axis parabolic concave mirror 634 will decrease. The beam diameter D3 of the pulsed laser beam which is output from the off axis parabolic concave mirror 634 will be slightly smaller than the beam diameter D1 of the pulsed laser beam that enters the off axis parabolic concave mirror 631, but the beam diameters D3 and D1 are substantially equal. Further, the optical axis OA1 of the pulsed laser beam that enters the off axis parabolic concave mirror 631 matches the optical axis OA5 of the pulsed laser beam which is output from the off axis parabolic concave mirror 634.

As another example, as illustrated in FIG. 5C, the controller 58 may decrease the distance H by dL from the state illustrated in FIG. 5A. The diverging angle of the pulsed laser beam which is output from the off axis parabolic concave mirror 634 will increase. The beam diameter D3 of the pulsed laser beam which is output from the off axis parabolic concave mirror 634 will be slightly greater than the beam diameter D1 of the pulsed laser beam that enters the off axis parabolic concave mirror 631, but the beam diameters D3 and D1 are substantially equal. Further, the optical axis OA1 of the pulsed laser beam that enters the off axis parabolic concave mirror 631 matches the optical axis OA5 of the pulsed laser beam which is output from the off axis parabolic concave mirror 634.

Figure 6:
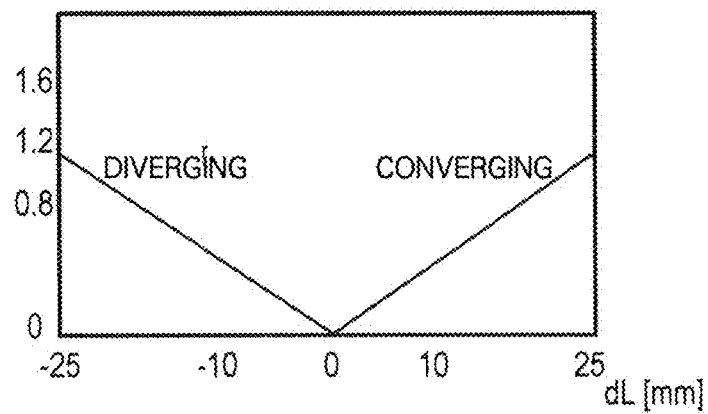
FIG. 6 is a diagram that illustrates the results of calculation of diverging angles (half angles) with respect to distances dL of movement of the movable plate from the state illustrated in FIG. 5A.

FIG. 6 is a diagram that illustrates the results of calculation of diverging angles (half angles) with respect to distances dL of movement of the movable plate 637 from the state illustrated in FIG. 5A, in the configurations illustrated in FIG. 5A through FIG. 5C. As illustrated in FIG. 6, the diverging angles increase and decrease substantially linearly with respect to the distances dL.

<Effects>

The beam adjusting apparatus 630 of the present embodiment is capable of changing the diverging angle of output light, while suppressing changes from the beam diameter of an input pulsed laser beam to the beam diameter of an output pulsed laser beam. Further, the beam adjusting apparatus 630 of the present embodiment is capable of changing the diverging angle of output light, while matching the optical axis of the input pulsed laser beam and the optical axis of the output pulsed laser beam.

In the beam adjusting apparatus 630 of the present embodiment, the diverging angle increases and decreases substantially linearly with respect to the distance H. Therefore, the controller 58 is capable of easily adjusting the diverging angle of light output from the beam adjusting apparatus 630. The beam adjusting apparatus 630 of the present embodiment is capable of suppressing changes in the beam shape, by matching the focal points of the off axis parabolic concave mirrors and the focal points of the off axis parabolic convex mirrors.

The beam adjusting apparatus 630 of the present embodiment is capable of changing the diverging angle without changing the input position and the output position of the pulsed laser beam at the beam adjusting apparatus 630, by fixing the positions of the off axis parabolic concave mirrors 631 and 634 and moving the positions of the off axis parabolic convex mirrors 632 and 633.

In the present embodiment, the reflection angles of the off axis parabolic concave mirrors 631 and 634 and the off axis parabolic convex mirrors 632 and 633 are 45 degrees. Therefore, the diverging angles can be adjusted by moving the off axis parabolic convex mirrors 632 and 633 in the same direction. Note, however, that it is not necessary for the reflection angles of the off axis parabolic concave mirrors 631 and 634 and the off axis parabolic convex mirrors 632 and 633 to be 45 degrees.

As described above, the beam adjusting apparatus 630 of the present embodiment facilitates focus adjustments of the pulsed laser beam onto the target 27, and appropriate irradiation conditions of the pulsed laser beam with respect to the target 27 can be maintained.

<Modification>

Figure 7:
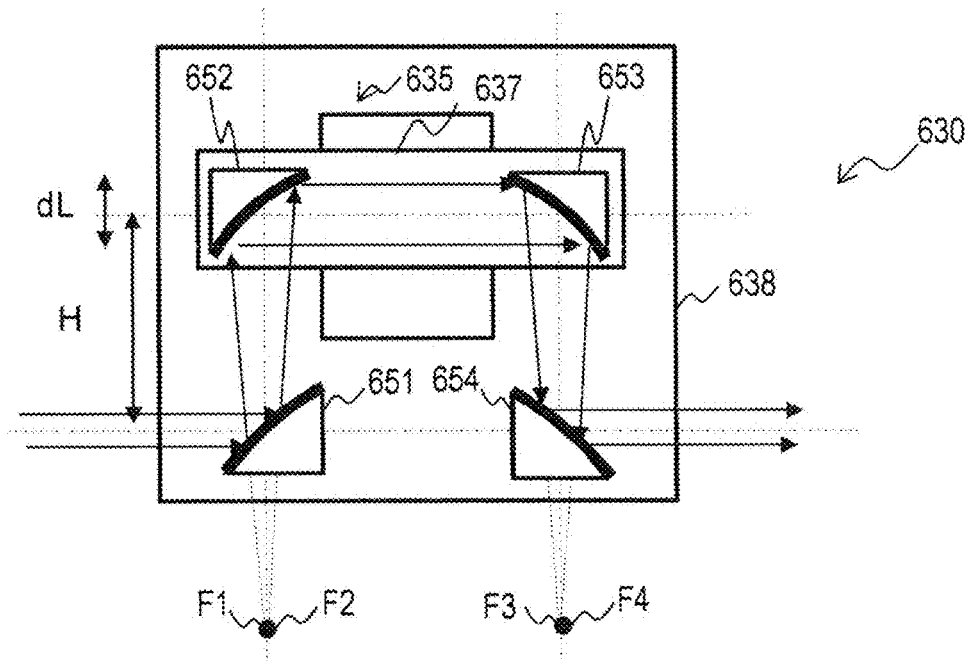
FIG. 7 is a diagram that illustrates a modification of the beam adjusting apparatus of the first embodiment.

FIG. 7 is a diagram that illustrates an example of a modification of the beam adjusting apparatus 630 of the present embodiment. The order of arrangement of the off axis parabolic concave mirrors and the off axis parabolic convex mirrors of the beam adjusting apparatus 630 may be reversed from that of the configuration illustrated in FIG. 5A.

Specifically, the beam adjusting apparatus 630 may include off axis parabolic convex mirrors 651 and 654 and off axis parabolic concave mirrors 652 and 653. The off axis parabolic convex mirror 651, the off axis parabolic concave mirror 652, the off axis parabolic concave mirror 653, and the off axis parabolic convex mirror 654 may be provided in this order along the optical path of a pulsed laser beam. The other constituent elements and the operations of the beam adjusting apparatus 630 may be the same as those of the configurations illustrated in FIG. 5A through FIG. 5C.

5. Second Embodiment

<Configuration>

Figure 8:
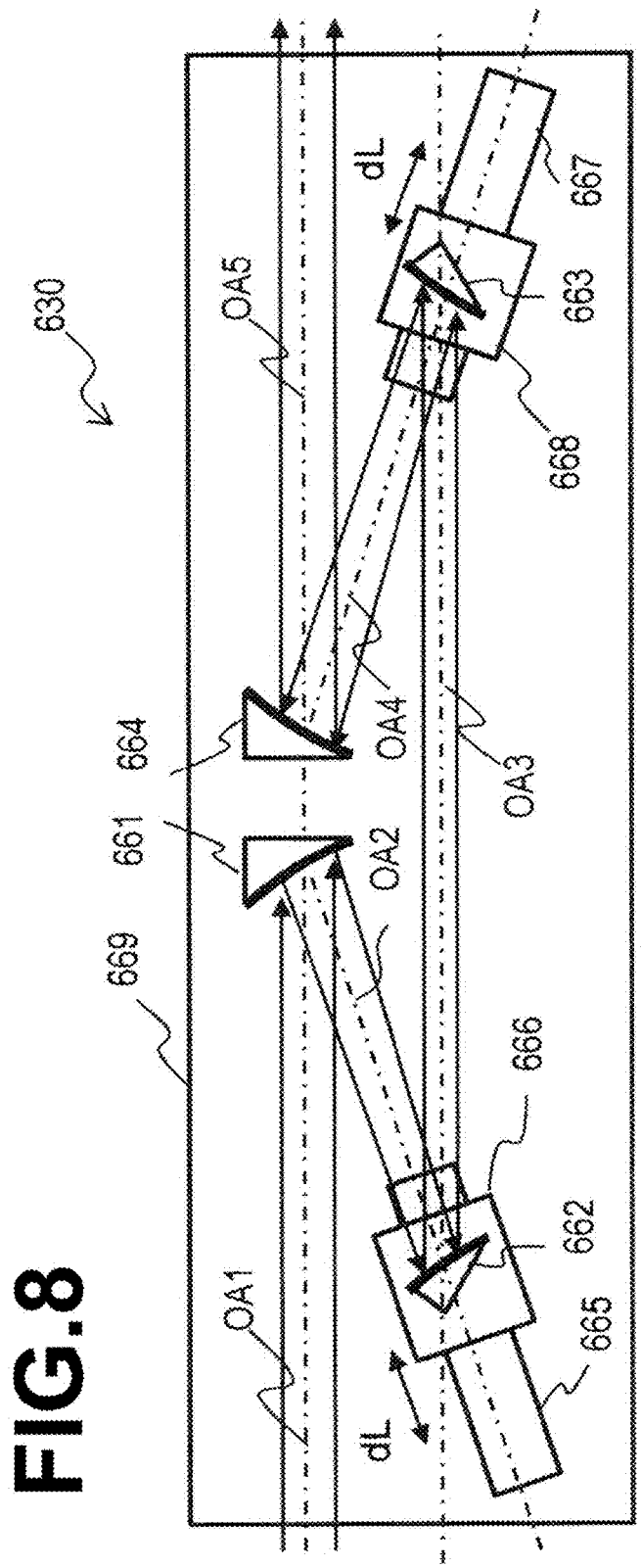
FIG. 8 is a diagram that illustrates an example of the configuration of a beam adjusting apparatus of a second embodiment.

FIG. 8 is a diagram that illustrates an example of the configuration of a beam adjusting apparatus 630 of a second embodiment. Hereinafter, descriptions will mainly be given of points of difference from the first embodiment. In the beam adjusting apparatus 630, the reflection angles of the mirrors need not be 45 degrees, and may be less than 45 degrees. The reflective surfaces of the mirrors may be curved surfaces other than off axis parabolic surfaces, and may be spherical surfaces, for example.

Specifically, the beam adjusting apparatus 630 may include spherical concave mirrors 661 and 664 and spherical convex mirrors 662 and 663, as illustrated in FIG. 8. The spherical concave mirror 661, the spherical convex mirror 662, the spherical convex mirror 663, and the spherical concave mirror 664 may be provided in this order along the optical path of a pulsed laser beam. The spherical concave mirrors 661 and 664 may have reflective curved surfaces which are of shapes represented by the same function. The spherical convex mirrors 662 and 663 may have reflective curved surfaces which are of shapes represented by the same function.

The spherical concave mirror 661, the spherical convex mirror 662, the spherical convex mirror 663 and the spherical concave mirror 664 may be provided such that an optical axis OA1 of a pulsed laser beam that enters the spherical concave mirror 661 and an optical axis OA5 of a pulsed laser beam which is output from the spherical concave mirror 664 are matched.

The spherical concave mirror 661, the spherical convex mirror 662, the spherical convex mirror 663 and the spherical concave mirror 664 may be provided such that an optical axis OA2 between the spherical concave mirror 661 and the spherical convex mirror 662 and an optical axis OA4 between the spherical convex mirror 663 and the spherical concave mirror 664 are linearly symmetrical with respect to an axis perpendicular to the optical axis OA1. The spherical concave mirror 661, the spherical convex mirror 662, the spherical convex mirror 663 and the spherical concave mirror 664 may be provided such that an optical axis OA3 between the spherical convex mirror 662 and the spherical convex mirror 633, the optical axis OA1, and the optical axis OA5 are parallel to each other.

The angle between the optical axis OA3 and the optical axis OA4 as well as the angle between the optical axis OA4 and the optical axis OA5 may be less than 90 degrees, and further may be less than 40 degrees, respectively. That is, the reflection angles of the spherical concave mirror 661 and the spherical convex mirror 662 may be less than 45 degrees, and further may be less than 20 degrees.

The angle between the optical axis OA1 and the optical axis OA2 as well as the angle between the optical axis OA2 and the optical axis OA3 may be less than 90 degrees, and further may be less than 40 degrees, respectively. That is, the reflection angles of the spherical convex mirror 663 and the spherical concave mirror 664 may be less than 45 degrees, and further may be less than 20 degrees.

The beam adjusting apparatus 630 may further include a base plate 669 and two uniaxial movement stages 665 and 667. The uniaxial movement stages 665 and 667 may include movable plates 666 and 668, respectively. The uniaxial movement stages 665 and 667 may be moving apparatuses configured to move mirrors on the movable plates 666 and 668.

The uniaxial movement stages 665 and 667 may be provided on the base plate 669. The uniaxial movement stages 665 and 667 may be configured to move the movable plates 666 and 668 with respect to the base plate 669, respectively. The direction of movement of the movable plate 666 may be parallel to the optical axis OA2 between the spherical concave mirror 661 and the spherical convex mirror 662. The direction of movement of the movable plate 668 may be parallel to the optical axis OA4 between the spherical convex mirror 663 and the spherical concave mirror 664.

The spherical concave mirrors 661 and 664 may be fixed to the base plate 669. The spherical convex mirror 662 may be fixed to the movable plate 666. The distance between the spherical convex mirror 662 and the spherical concave mirror 661 increases and decreases accompanying movement of the movable plate 666. The spherical convex mirror 663 may be fixed to the movable plate 668. The distance between the spherical convex mirror 663 and the spherical concave mirror 664 increases and decreases accompanying movement of the movable plate 668.

<Operation>

A controller 58 may adjust the diverging angle of a pulsed laser beam which is output from the beam adjusting apparatus 630 by moving the movable plates 666 and 668. The controller 58 may change the distance between the spherical concave mirror 661 and the spherical convex mirror 662 as well as the distance between the spherical convex mirror 663 and the spherical concave mirror 664 such that they simultaneously increase or simultaneously decrease.

In the example illustrated in FIG. 8, the movable plates 666 and 668 may be moved by the controller 58 such that the distance between the spherical concave mirror 661 and the spherical convex mirror 662 is the same as the distance between the spherical convex mirror 663 and the spherical concave mirror 664.

The changes in diverging angles by increasing and decreasing the distance between the spherical concave mirror 661 and the spherical convex mirror 662 as well as the distance between the spherical convex mirror 663 and the spherical concave mirror 664 are the same as those of the first embodiment. The present embodiment can suppress changes in the beam diameter and the optical axis that accompany adjustment of the diverging angle by the beam adjusting apparatus 630. In addition, changes in the beam shape due to reflection by the spherical mirrors can be suppressed, by setting the reflection angles of the mirrors to be small.

6. Third Embodiment

<Configuration>

Figure 9:
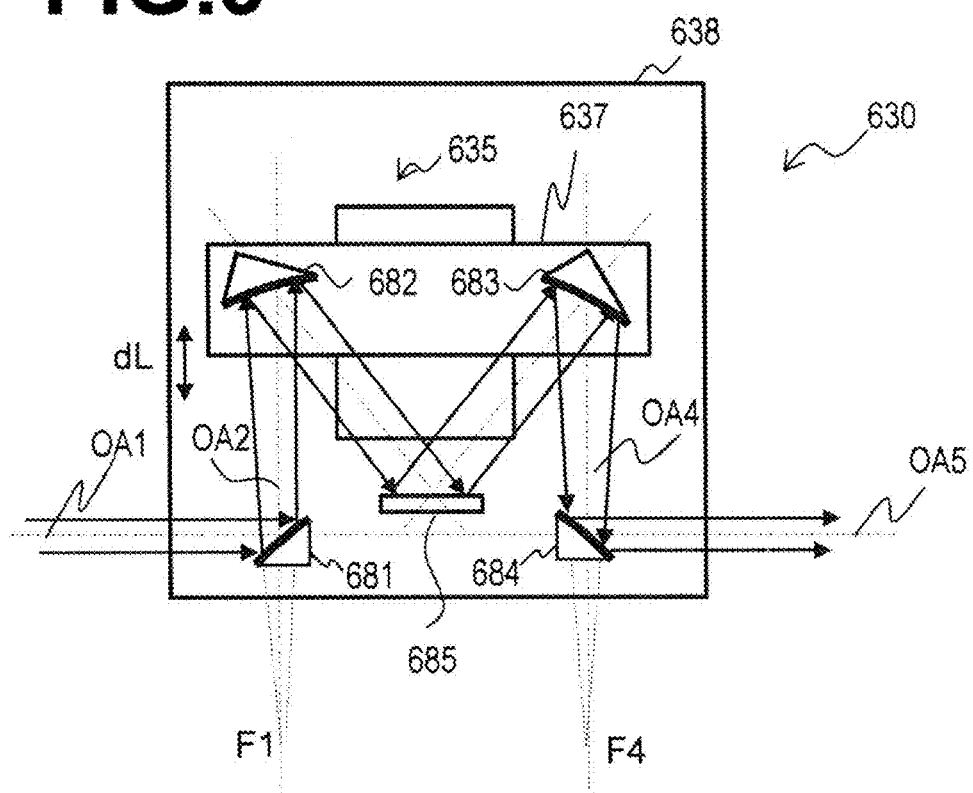
FIG. 9 is a diagram that illustrates an example of the configuration of a beam adjusting apparatus of a third embodiment.

FIG. 9 is a diagram that illustrates an example of the configuration of a beam adjusting apparatus 630 according to a third embodiment. Hereinafter, descriptions will mainly be given of points of difference from the first embodiment. The beam adjusting apparatus 630 may include off axis parabolic convex mirrors 681 and 684, spherical concave mirrors 682 and 683, and a planar mirror 685. The off axis parabolic convex mirror 681, the spherical concave mirror 682, the planar mirror 685, the spherical concave mirror 683, and the off axis parabolic convex mirror 684 may be provided in this order along the optical path of a pulsed laser beam.

In the configuration of the present embodiment, spherical concave mirrors 682 and 683 may be provided instead of the off axis parabolic concave mirrors 652 and 653 when compared with the modification of the first embodiment. Further, the planar mirror 685 may be provided between the spherical concave mirrors 682 and 683.

<Operation>

The spherical concave mirror 682 may reflect an input pulsed laser beam at a reflection angle of less than 45 degrees. The reflection angle may be less than 20 degrees. The pulsed laser beam which is reflected by the spherical concave mirror 682 may enter the planar mirror 685. Light which is reflected by the planar mirror 685 may enter the spherical concave mirror 683. The spherical concave mirror 683 may reflect the input pulsed laser beam at a reflection angle of less than 45 degrees. The reflection angle may be less than 20 degrees. The changes in diverging angles due to movement of a movable plate 637 are the same as those of the first embodiment.

The planar mirror 685 enables the reflection angles of the spherical concave mirrors 682 and 683 to be small angles of less than 45 degrees. For this reason, changes in the beam shape caused by reflection by the spherical concave mirrors 682 and 683 can be suppressed.

7. Fourth Embodiment

<Configuration>

Figure 10:
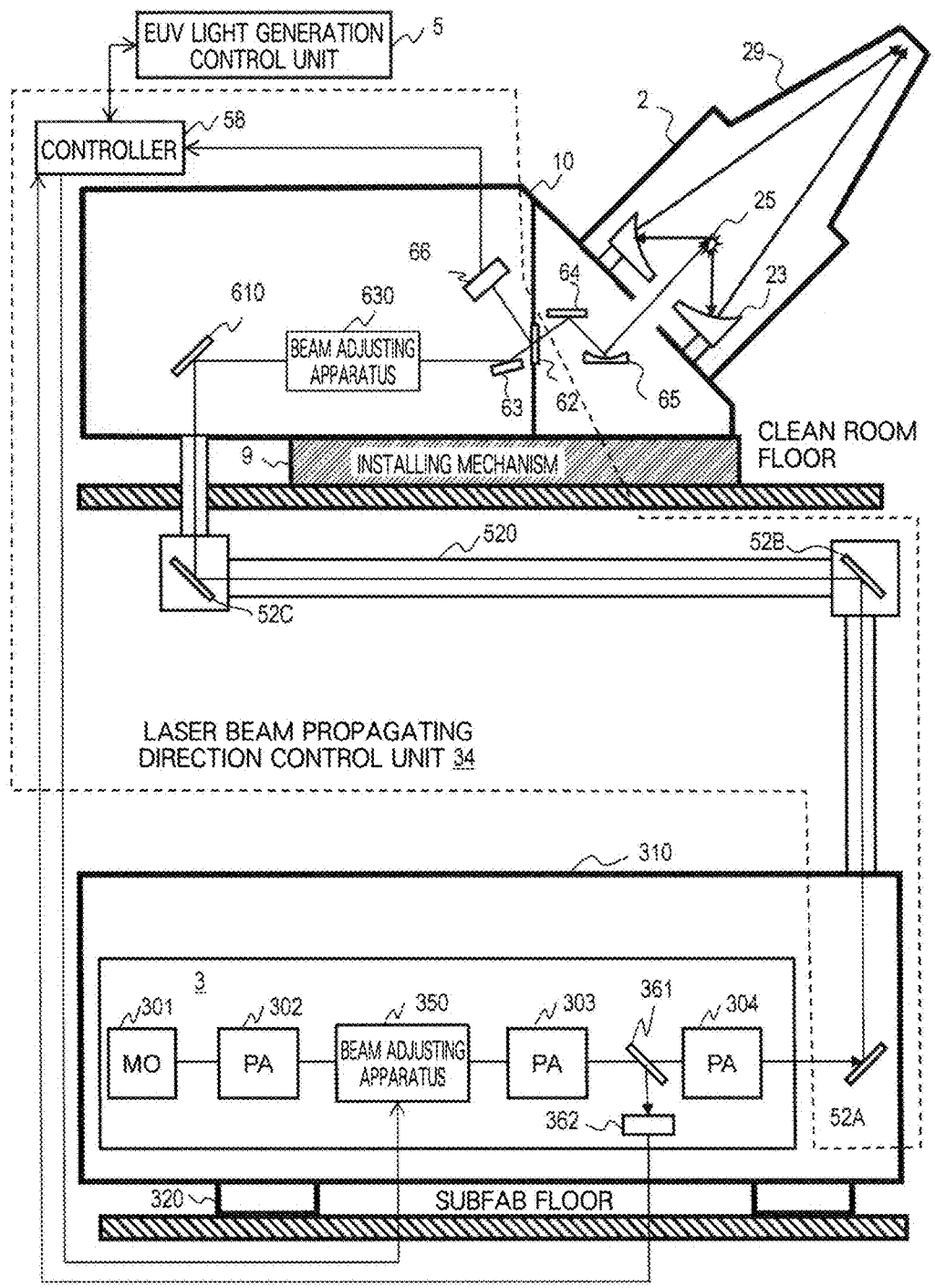
FIG. 10 is a diagram that illustrates an example of the configuration of an EUV light generating system of a fourth embodiment.

FIG. 10 is a diagram that illustrates an example of the configuration of an EUV light generating system 11 of a fourth embodiment. The EUV light generating system 11 may include a beam adjusting apparatus within a laser apparatus 3. Further, the EUV light generating system 11 may include a beam adjusting apparatus downstream from the laser apparatus 3, and the configurations of the beam adjusting apparatuses may be different.

Hereinafter, descriptions will mainly be given of points of difference from the first embodiment. The laser apparatus 3 may include an oscillator (MO) 301, amplifiers (PA) 302 through 304, a beam adjusting apparatus 350, a beam sampler 361, and a beam monitor 362.

The oscillator 301 may be constituted by one or a plurality of laser sources. The oscillator 301 may be configured to output a pulsed laser beam of a wavelength which is amplifiable by the amplifiers 302 through 304. The laser sources may be quantum cascade lasers. In the case that a plurality of laser sources are provided, the optical paths of the pulsed laser beams from each of the laser sources may be caused to match by a beam combiner or the like, which is not illustrated.

The amplifiers 302 through 304 may be provided in this order along an optical path within the laser apparatus 3. The amplifiers 302 through 304 respectively amplify the pulsed laser beam input thereto at a predetermined gain.

The beam sampler 361 may be provided along the optical path within the laser apparatus 3. The beam sampler 361 may output a portion of the pulsed laser beam in a direction different from that of the pulsed laser beam as sampled light. The sampled light may be a portion of the pulsed laser beam which is reflected by the beam sampler 361, or a portion of the pulsed laser beam which is transmitted by the beam sampler 361.

The beam monitor 362 may be provided at a position capable of receiving the sampled light output from the beam sampler 361. The beam monitor 362 may monitor the profile of the sampled light. The beam monitor 362 may be connected to a controller 58.

The beam adjusting apparatus 350 may be provided upstream from the beam sampler 361 along the optical path within the laser apparatus 3. For example, the beam adjusting apparatus 350 may be provided between the amplifier 302 and the amplifier 303, and the beam sampler 361 may be provided between the amplifier 303 and the amplifier 304. The beam adjusting apparatus 350 may be connected to the controller 58.

The beam adjusting apparatus 350 may have the same configuration as that of the first embodiment illustrated in FIG. 5A. Specifically, the beam adjusting apparatus 350 may include mirrors, which are an off axis parabolic concave mirror 631, an off axis parabolic convex mirror 632, an off axis parabolic convex mirror 633, and an off axis parabolic concave mirror 634, provided in this order.

A beam adjusting apparatus 630 may have the same configuration as that of the modification of the first embodiment illustrated in FIG. 7. Specifically, the beam adjusting apparatus 630 may include mirrors, which are an off axis parabolic convex mirror 651, an off axis parabolic concave mirror 652, an off axis parabolic concave mirror 653, and an off axis parabolic convex mirror 654, provided in this order.
<Operation>

The pulsed laser beam which is output from the oscillator 301 is sequentially amplified by the amplifiers 302 through 304, and is output from the laser apparatus 3. The beam sampler 361 may reflect a portion of the pulsed laser beam which is output form the amplifier 303 toward the beam monitor 362 as sampled light.

The beam monitor 362 may detect the profile of the sampled light and transmit detected values related to the profile to the controller 58. The controller 58 may calculate parameters of the pulsed laser beam from the transmitted detected values. The parameters which are calculated may be a beam diameter and a center position of the beam, for example.

The controller 58 may control the beam adjusting apparatus 350 such that the calculated parameters become predetermined values. For example, the controller 58 may control the diverging angle of the pulsed laser beam using the beam adjusting apparatus 350 such that the beam diameter becomes a predetermined size.

The pulsed laser beam which has a predetermined diverging angle by being adjusted by the beam adjusting apparatus 350 may be amplified further by the amplifier 304, and may enter the beam adjusting apparatus 630 via high reflectance mirrors 52A through 52C and 610. The other operations may be the same as those of the first embodiment.
<Effects>

The present embodiment adjusts the diverging angle of the pulsed laser beam with the beam adjusting apparatus 350 within the laser apparatus 3, to adjust the beam diameter and the center position of the pulsed laser beam that enters the amplifier 303 thereafter. Thereby, at the amplifier 303 into which the pulsed laser beam enters next, the pulsed laser beam being shielded by interior components will be suppressed, and damage to inner optical elements caused by the pulsed laser beam being collected on the inner optical elements can also be suppressed.

The pulsed laser beam is collected once within the interior of the beam adjusting apparatus illustrated in FIG. 5A. Meanwhile, the pulsed laser beam is diverged once within the interior of the beam adjusting apparatus illustrated in FIG. 7. Accordingly, the sizes of the mirrors can be smaller in the configuration illustrated in FIG. 5A compared to the configuration illustrated in FIG. 7. Meanwhile, the energy density which is irradiated onto the mirrors can be smaller in the configuration illustrated in FIG. 7 compared to the configuration illustrated in FIG. 5A.

The present embodiment applies the configuration of FIG. 5A to the beam adjusting apparatus 350 within the laser apparatus 3. Thereby, the size of the beam adjusting apparatus 350 within the laser apparatus 3 can be miniaturized. In addition, the energy of the pulsed laser beam between the oscillator 301 and the amplifier 302, as well as the energy of the pulsed laser beam among the amplifiers, is smaller compared to that of the pulsed laser beam which is output from the laser apparatus 3. Accordingly, damage to the mirrors of the beam adjusting apparatus 350 can be avoided.

Meanwhile, the configuration of FIG. 7 is applied to the beam adjusting apparatus 630 provided downstream from the laser apparatus 3 in the vicinity of the entrance to a chamber. Thereby, the energy density of the pulsed laser beam that enters the mirrors within the beam adjusting apparatus 630 is decreased, suppressing damage to the mirrors as a result.

Note that the positions at which the beam adjusting apparatus 350 and the beam sampler 361 are provided may be different from the positions illustrated in FIG. 10. For example, the beam adjusting apparatus 350 may be provided after the oscillator 301, and the beam sampler 361 may be provided after the amplifier 304. By adopting such a configuration, the spot position of the laser beam that enters the high reflectance mirror 52A via the amplifiers 302 through 304 can be adjusted.

8. Fifth Embodiment

<Configuration>

Figure 11:
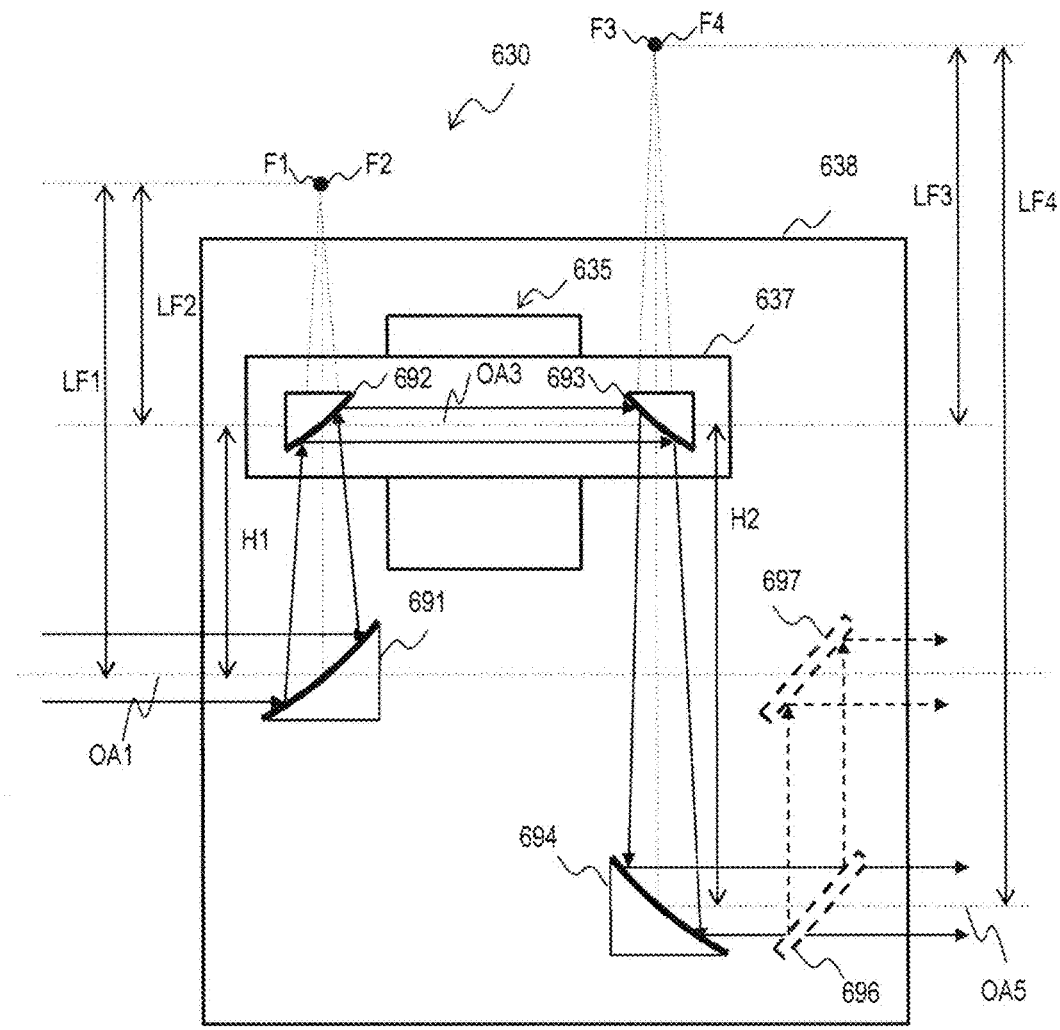
FIG. 11 is a diagram that illustrates an example of the configuration of a beam adjusting apparatus of a fifth embodiment.

FIG. 11 is a diagram that illustrates an example of the configuration of a beam adjusting apparatus 630 of a fifth embodiment. Hereinafter, descriptions will mainly be given of points of difference from the first embodiment. The beam adjusting apparatus 630 may include an off axis parabolic concave mirror 691, an off axis parabolic convex mirror 692, an off axis parabolic convex mirror 693, and an off axis parabolic concave mirror 694 instead of the off axis parabolic concave mirror 631, the off axis parabolic convex mirror 632, the off axis parabolic convex mirror 633, and the off axis parabolic concave mirror 634 of the first embodiment.

The off axis parabolic concave mirrors 691 and 694 and the off axis parabolic convex mirrors 692 and 693 may be arranged such that an optical axis OA1 of the pulsed laser beam that enters the off axis parabolic concave mirror 691 and an optical axis OA5 of the pulsed laser beam which is output from the off axis parabolic concave mirror 694 are parallel.

The off axis parabolic concave mirror 691 and the off axis parabolic convex mirror 692 may be provided such that a focal point F1 of the off axis parabolic concave mirror 691 and a focal point F2 of the off axis parabolic convex mirror 692 are matched in the state illustrated in FIG. 11. Further, the off axis parabolic convex mirror 693 and the off axis parabolic concave mirror 694 may be provided such that a focal point F3 of the off axis parabolic convex mirror 693 and a focal point F4 of the off axis parabolic concave mirror 694 are matched.

As described in connection with the first embodiment, the magnification M12 by the off axis parabolic concave mirror 691 and the off axis parabolic convex mirror 692 can be represented by LF1/LF2. The magnification M43 by the off axis parabolic concave mirror 694 and the off axis parabolic convex mirror 693 can be represented by LF4/LF3. LF1 and LF4 are the focal lengths of the off axis parabolic concave mirrors 691 and 694, respectively. LF2 and LF3 are the focal lengths of the off axis parabolic convex mirrors 692 and 693, respectively.

The off axis parabolic concave mirrors 691 and 694 and the off axis parabolic convex mirrors 692 and 693 may be configured such that M12=M43, while LF1≠LF4 and LF2≠LF3.

The off axis parabolic concave mirrors 691 and 694 may have reflective surfaces of shapes defined by different functions, and the focal length LF4 of the off axis parabolic concave mirror 694 may be longer than the focal length LF1 of the off axis parabolic concave mirror 691. The off axis parabolic convex mirrors 692 and 693 may have reflective surfaces of shapes defined by different functions, and the focal length LF3 of the off axis parabolic convex mirror 693 may be longer than the focal length LF2 of the off axis parabolic convex mirror 692. A distance H2 between the off axis parabolic concave mirror 694 and the off axis parabolic convex mirror 693 may be longer than a distance H1 between the off axis parabolic concave mirror 691 and the off axis parabolic convex mirror 692.

The beam adjusting apparatus 630 may further include planar mirrors 696 and 697. The optical axis OA1 of the pulsed laser beam that enters the off axis parabolic concave mirror 691 and the optical axis OA5 of the pulsed laser beam which is output from the off axis parabolic concave mirror 694 may be matched.

Specifically, the planar mirror 696 may be provided to face the off axis parabolic concave mirror 694. Light reflected by the off axis parabolic concave mirror 694 may enter the planar mirror 696. Further, the planar mirror 697 may be provided to face the planar mirror 696. Light reflected by the planar mirror 696 may enter the planar mirror 697. The optical axis of the pulsed laser beam which is reflected by the planar mirror 697 may match the optical axis OA1.

The planar mirrors 696 and 697 may not be provided in the case that it is not necessary for the optical axis OA1 of the pulsed laser beam that enters the off axis parabolic concave mirror 691 and the optical axis OA5 of the pulsed laser beam which is output from the off axis parabolic concave mirror 694 to match. The relationship between LF1 and LF4 as well as the relationship between LF2 and LF3 may be inverted.

<Operation>

The beam adjusting apparatus of the present embodiment operates in the same manner as the beam adjusting apparatus of the first embodiment. The beam adjusting apparatus of the present embodiment is capable of changing the diverging angle of output light while maintaining the beam diameter of an input pulsed laser beam and the beam diameter of an output pulsed laser beam to be substantially the same, in the same manner as the beam adjusting apparatus of the first embodiment. The beam adjusting apparatus of the present embodiment utilizes two planar mirrors, thereby enabling the diverging angle of output light to be changed, while matching the optical axis of an input pulsed laser beam and the optical axis of an output pulsed laser beam.

9. Sixth Embodiment

As described above, the uniaxial movable stage 635 may be configured to move the movable plate 637 with respect to the base plate 638. That is, in the beam adjusting apparatus 630, the off axis parabolic convex mirrors 632 and 633 which are fixed on the movable plate 637 move with respect to the base plate 638 when the movable plate 637 moves. Meanwhile, each of the off axis parabolic concave mirrors 631 and 634 and the off axis parabolic convex mirrors 632 and 633 generate heat, accompanying irradiation by the pulsed laser beam. For this reason, a configuration may be considered for the beam adjusting apparatus 630, in which channels, through which a coolant medium such as cooling water flows, are formed in the interiors of each of the off axis parabolic mirrors, and cooling pipes, through which the coolant medium flows, are attached to each of the off axis parabolic mirrors. However, if cooling pipes are simply attached to the of axis parabolic mirrors, tensile force or compressive force will be applied to the cooling pipes which are attached to the off axis parabolic convex mirrors 632 and 633 when the movable plate 637 moves. At this time, reactive force from the cooling pipes is applied to these off axis parabolic mirrors, which may result in the positions and orientations of these off axis parabolic mirrors becoming shifted. Therefore, the beam adjusting apparatus 630 may not be able to achieve desired values for the diverging angle, the direction of the optical axis, and the beam diameter of an output pulsed laser beam, and the pulsed laser beam may not propagate in an appropriate manner.

In the description below, the off axis parabolic concave mirrors 631 and 634 as well as the off axis parabolic convex mirrors 632 and 633 which are included in the beam adjusting apparatus 630 will also be collectively referred to as off axis parabolic mirrors 631 through 634.

<Configuration>

Figure 12:
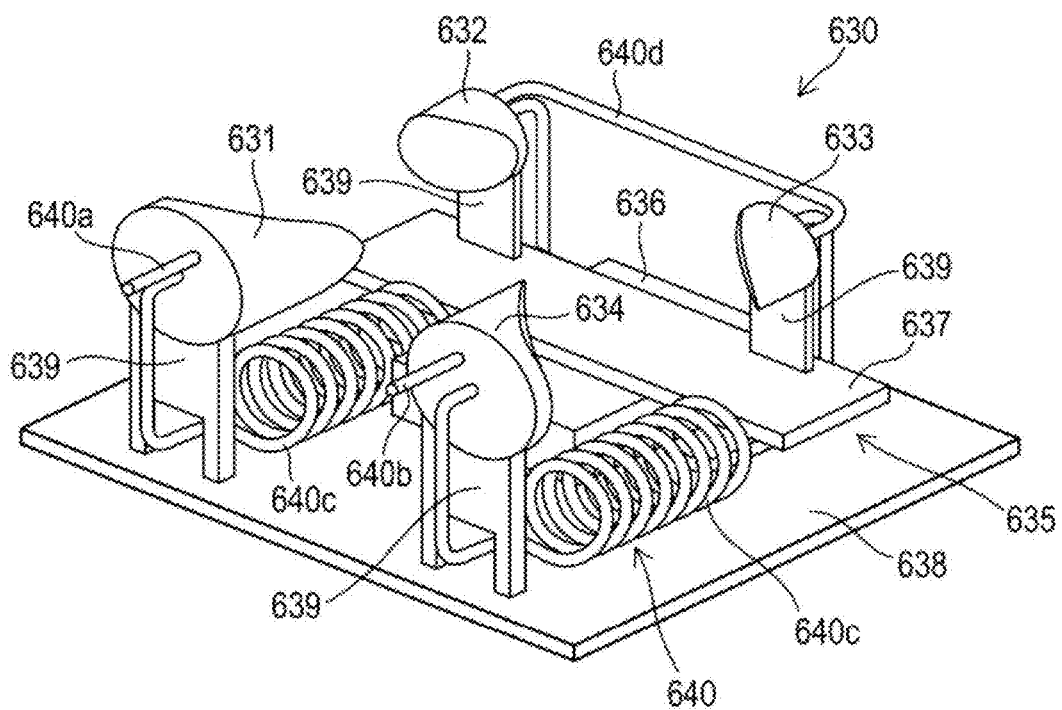
FIG. 12 is a perspective view of an example of the configuration of a beam adjusting apparatus of a sixth embodiment.
Figure 13:
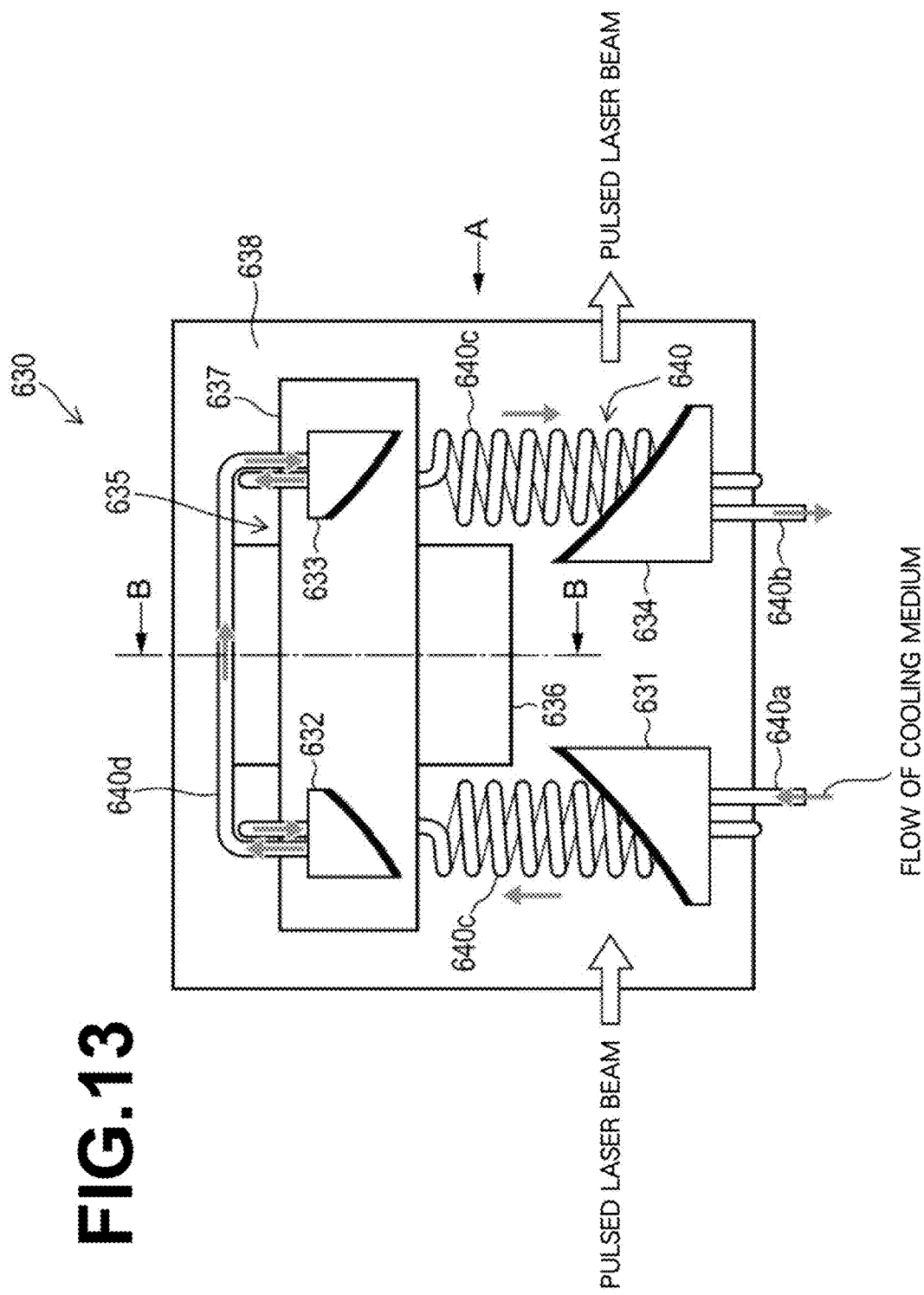
FIG. 13 is a plan view of the example of the configuration of the beam adjusting apparatus of the sixth embodiment.

FIG. 12 is a perspective view of an example of the configuration of a beam adjusting apparatus 630 of a sixth embodiment. FIG. 13 is a plan view of the example of the configuration of the beam adjusting apparatus 630 of the sixth embodiment. Hereinafter, descriptions will mainly be given of points of difference from the first embodiment. The beam adjusting apparatus 630 may further include cooling pipes 640. The cooling pipes 640 may be coupled to an inlet opening and an outlet opening which are provided on the rear surfaces of each of the off axis parabolic mirrors 631 through 634. The inlet openings which are provided in each of the off axis parabolic mirrors 631 through 634 may be entrances for a coolant medium that flows within the cooling pipes 640 to flow into the off axis parabolic mirrors 631 through 634. The outlet openings which are provided in each of the off axis parabolic mirrors 631 through 634 may be exits for the coolant medium that flows within the off axis parabolic mirrors 631 through 634 to flow out to the cooling pipes 640.

Each of the cooling pipes 640 may include a supply opening 640a, a discharge opening 640b, a spiral pipe portion 640c and a straight pipe portion 640d. The supply opening 640a may be an entrance through which the coolant medium within the cooling pipes 640 is supplied from an external cooling apparatus such as a chiller. The discharge opening 640b may be an exit through which the coolant medium within the cooling pipes 640 is discharged to the external cooling apparatus such as a chiller. The spiral pipe portion 640c may be a portion of the cooling pipes 640 which is formed in a substantially spiral shape. The straight pipe portion 640d may be a portion of the cooling pipes 640 which is formed in a substantially linear shape.

The cooling pipe 640 that includes the supply opening 640a may connect the inlet opening of the of axis parabolic concave mirror 631, into which the pulsed laser beam enters, with the external cooling apparatus. The cooling pipe 640 that includes the spiral pipe portion 640c may connect the outlet opening of the off axis parabolic concave mirror 631 and the inlet opening of the off axis parabolic convex mirror 632. The cooling pipe 640 that includes the straight pipe portion 640d may connect the outlet opening of the off axis parabolic convex mirror 632 and the inlet opening of the off axis parabolic convex mirror 633. The cooling pipe 640 that includes the spiral pipe portion 640c may connect the outlet opening of the off axis parabolic convex mirror 633 and the inlet opening of the off axis parabolic concave mirror 634. The cooling pipe 640 that includes the discharge opening 640b may connect the outlet opening of the off axis parabolic concave mirror 634 and the external cooling apparatus.

Figure 14:
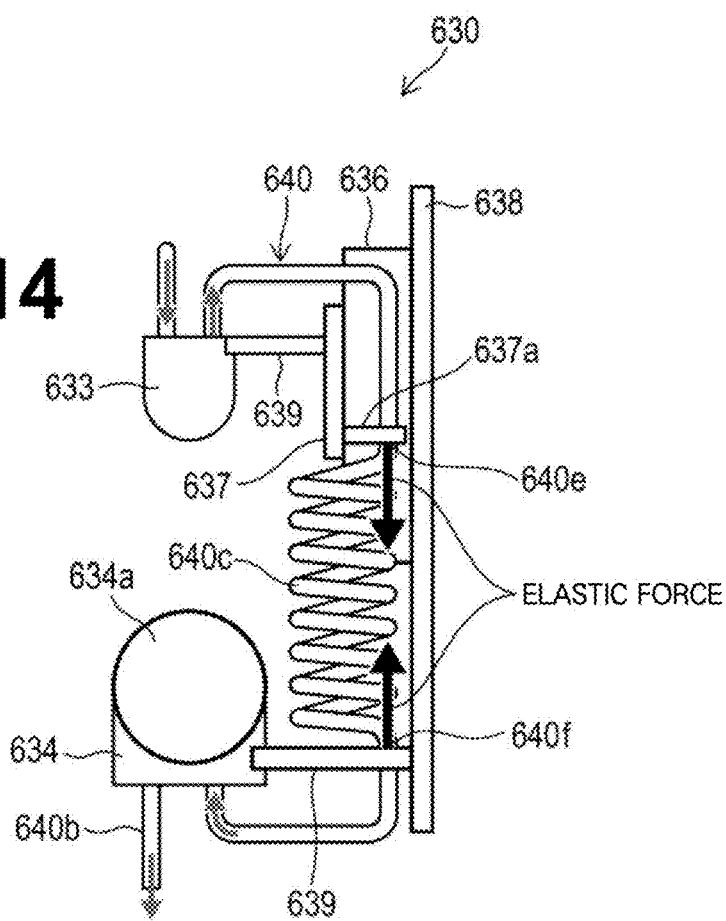
FIG. 14 is a diagram of the beam adjusting apparatus as viewed from the direction of arrow A illustrated in FIG. 13.

FIG. 14 is a diagram of the beam adjusting apparatus 630 as viewed from the direction of arrow A illustrated in FIG. 13. The spiral pipe portion 640c of the cooling pipes 640 may constitute a tension spring. The spiral pipe portion 640c may be wound in close contact, that is, formed to be a structure in which adjacent pipes are in close contact with each other. The spiral pipe portion 640c may be fixed to the movable plate 637 and the base plate 638 in a state in which a tensile load is imparted thereon, and provided along the direction of movement of the movable plate 637. A spiral starting point 640e at one end of the spiral pipe portion 640c may be fixed to a first movable piece 637a which is fixed to the movable plate 637. A spiral starting point 640f at the other end of the spiral pipe portion 640c may be fixed to a bracket 639 to be described later, which is fixed to the base plate 638.

Figure 15:
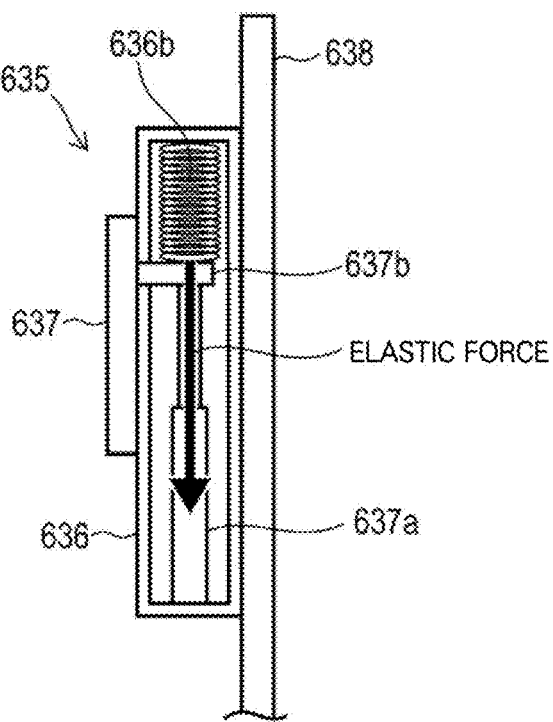
FIG. 15 is a partial sectional diagram of a uniaxial movement stage taken along line B-B of FIG. 13.

FIG. 15 is a partial sectional diagram of a uniaxial movement stage 635 taken along line B-B illustrated in FIG. 13. A base 636 of the uniaxial movement stage 635 may include an actuator 636a and a spring 636b. The actuator 636a may be connected to a second movable piece 637b which is fixed to the movable plate 637, and be provided along the direction of movement of the movable plate 637. The actuator 636a may expand and contract along the direction of movement of the movable plate 637, and move the movable plate 637 via the second movable piece 637b. The spring 636b may be connected to the second movable piece 637b at a side opposite the actuator 636a, and be provided along the direction of expansion and contraction of the actuator 636a and the spiral pipe portion 640c. The spring 636b may be a compression spring that presses the second movable piece 637b toward the actuator 636a by the elastic force thereof.

Figure 16:
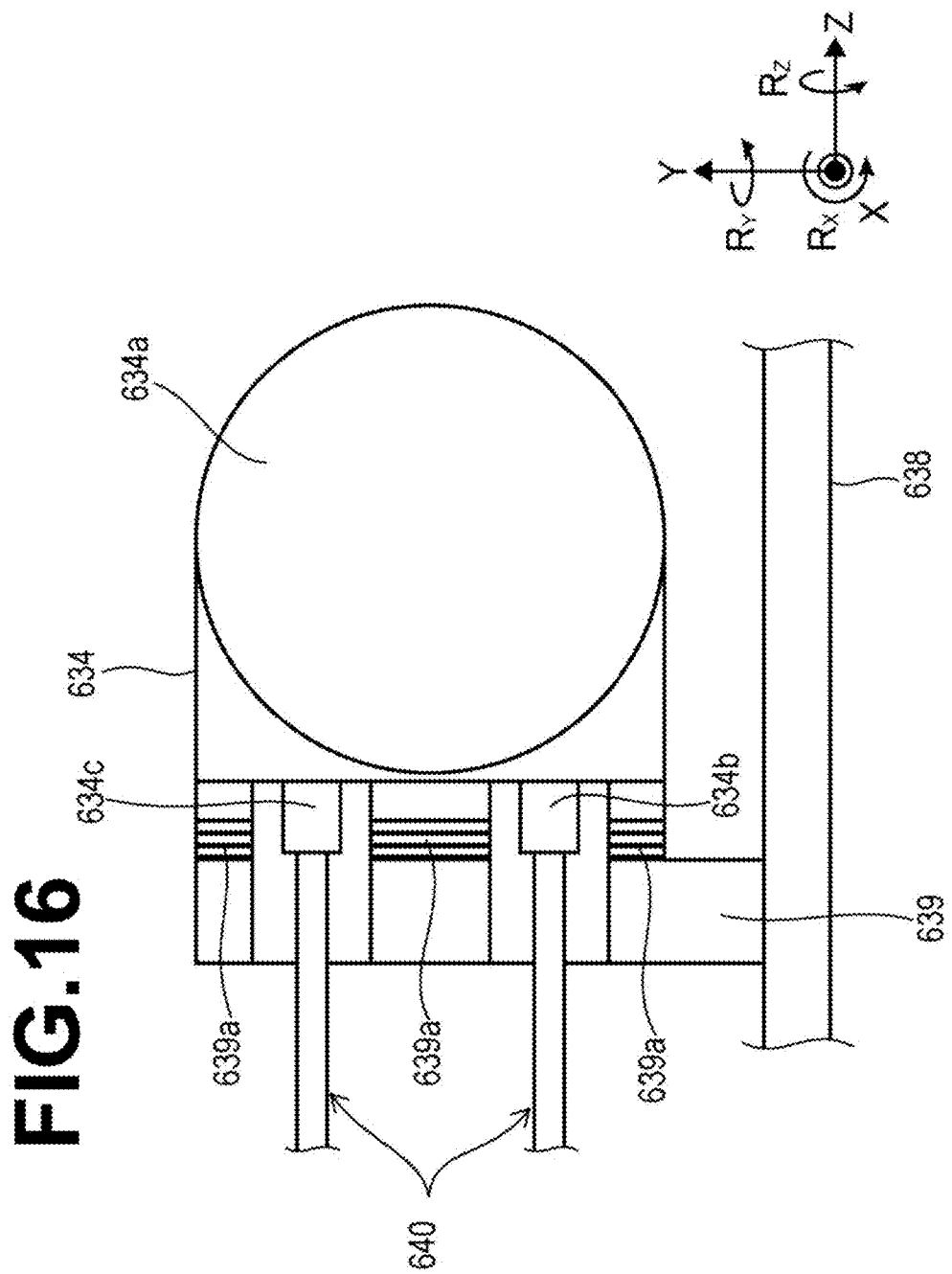
FIG. 16 is a diagram that illustrates an example of a mounting configuration of off axis parabolic mirrors to a base plate.

FIG. 16 is a diagram that illustrates an example of a mounting configuration of the off axis parabolic mirrors 631 through 634 onto the base plate 638. The mounting configurations of each of the off axis parabolic mirrors 631 through 634 onto the base plate 638 may be substantially the same. An example of a mounting configuration of the off axis parabolic concave mirror 634 onto the base plate 638 will be described as a representative example with reference to FIG. 16. The off axis parabolic concave mirror 634 may be mounted onto the base plate 638 employing the bracket 639. The bracket 639 may be formed to cover the inlet opening 634b and the outlet opening 634c, which are formed in the rear surface of the off axis parabolic concave mirror 634. The bracket 639 may be equipped with an adjuster 639a at a portion at which the bracket 639 connects with the rear surface of the off axis parabolic concave mirror 634. The adjuster 639a may be a mechanism which is capable of adjusting the position and the orientation of the off axis parabolic concave mirror 634 with six degrees of freedom, in three translational directions X, Y, and Z and in three rotational directions Rx, Ry, and Rz.

<Operation and Effects>

In the beam adjusting apparatus 630 of the present embodiment, the cooling pipes 640 are capable of expanding and contracting along the direction of movement of the movable plate 637 when the movable plate 637 moves. For this reason, the beam adjusting apparatus 630 of the present embodiment is capable of cooling the off axis parabolic mirrors 631 through 634 while suppressing shifts in the positions and orientations of the off axis parabolic mirrors 631 through 634 when the movable plate 637 moves.

Further, in the beam adjusting apparatus 630 of the present embodiment, the spiral starting points 640e and 640f may respectively be fixed to the first movable piece 637a which is fixed to the movable plate 637 and the bracket 639 which is fixed to the base plate 638. Thereby, the beam adjusting apparatus 630 of the present embodiment is capable of suppressing transfer of changes in reactive force to the off axis parabolic mirrors 631 through 634, even if the elastic force of the spiral pipe portion 640c changes when the spiral pipe portion 640c expands and contracts.

Still further, in the beam adjusting apparatus 630 of the present embodiment, the spring 636b presses the second movable piece 637b toward the actuator 636a with the elastic force thereof. Thereby, the beam adjusting apparatus 630 of the present embodiment is capable of appropriately maintaining the orientation and the movement of direction of the second movable piece 637b even during expansion and contraction of the actuator 636a. Particularly, the beam adjusting apparatus 630 of the present embodiment can suppress the second movable piece 637b from separating from the actuator 636a due to reactive force to the elastic force of the spiral pipe portion 640c.

In addition, in the beam adjusting apparatus 630 of the present embodiment, the bracket 639 is equipped with the adjuster 639a. Therefore, the optical relative positions of each of the off axis parabolic mirrors 631 through 634 can be adjusted with high precision.

Accordingly, the beam adjusting apparatus 630 of the present embodiment is capable of adjusting the diverging angle, the direction of the optical axis, and the beam diameter of an output pulsed laser beam with high precision, while cooling the off axis parabolic mirrors 631 through 634. The beam adjusting apparatus 630 of the present embodiment is capable of causing the pulsed laser beam to propagate in a more appropriate manner.

<Modification>

Figure 17:
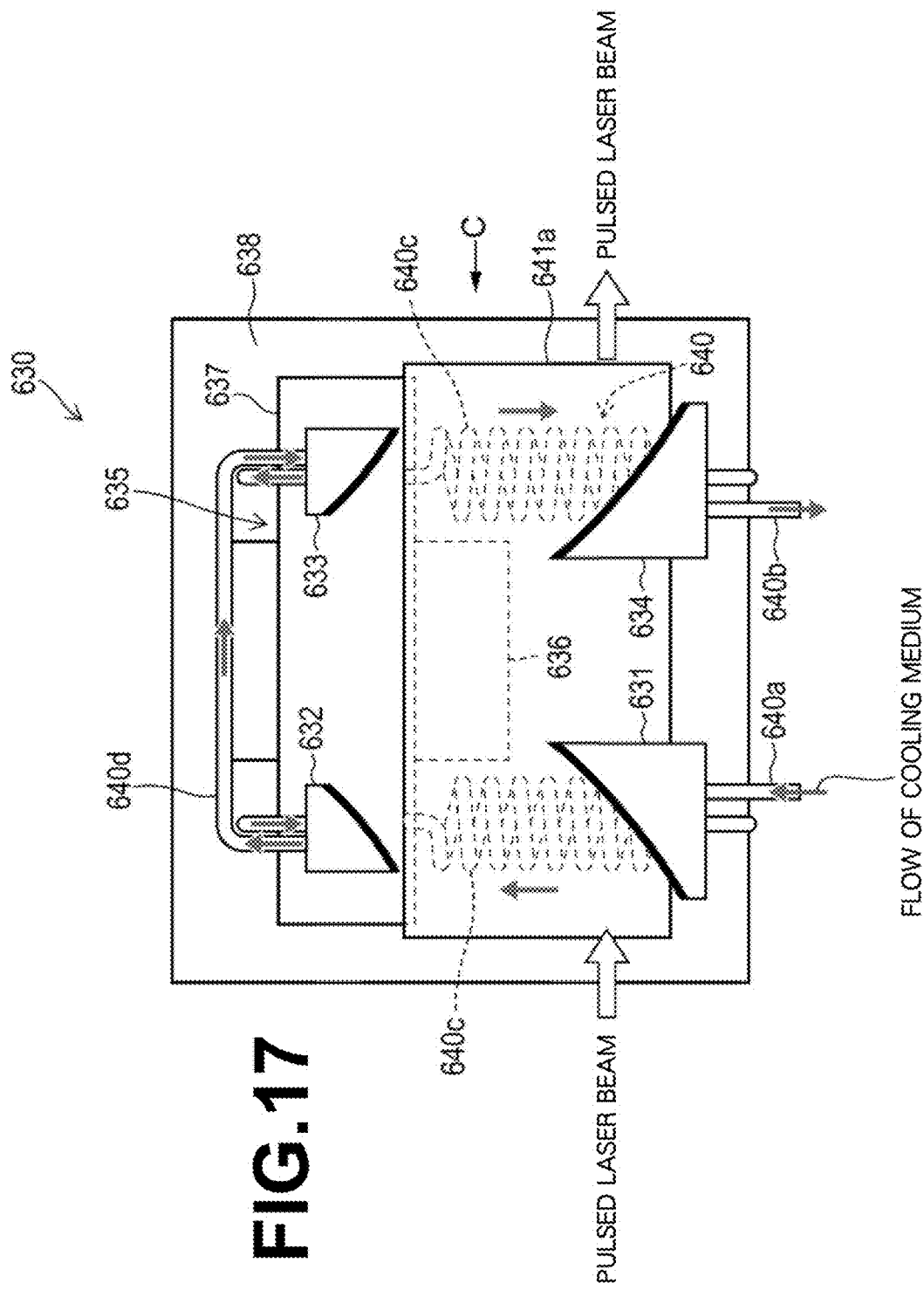
FIG. 17 is a diagram that illustrates a modification of the beam adjusting apparatus of the sixth embodiment.
Figure 18:
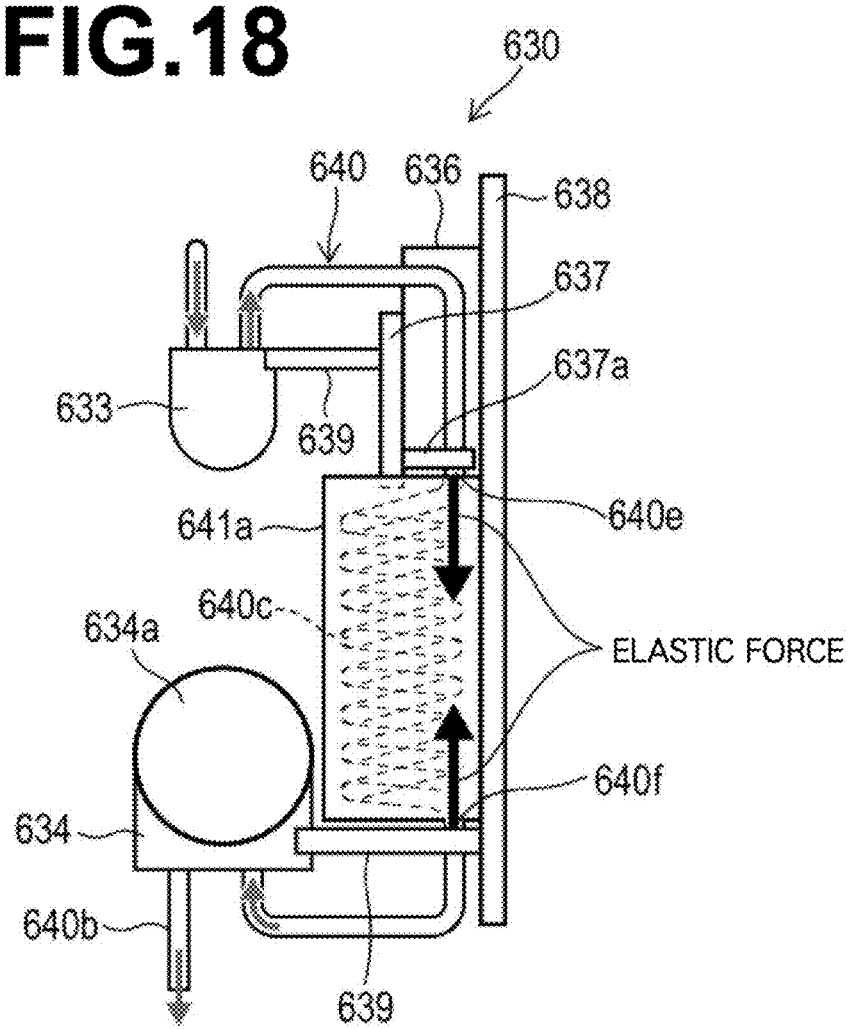
FIG. 18 is a diagram of the beam adjusting apparatus as viewed from the direction of arrow C illustrated in FIG. 17.

FIG. 17 is a diagram that illustrates a modification of the beam adjusting apparatus 630 of the sixth embodiment. FIG. 18 is a diagram of the beam adjusting apparatus 630 as viewed from the direction of arrow C illustrated in FIG. 17. The beam adjusting apparatus 630 may include a partition wall 641a. The partition wall 641a may shield constituent elements of the beam adjusting apparatus 630 which are positioned in the vicinity of the optical axis of the pulsed laser beam from the pulsed laser beam. The partition wall 641a may shield the spiral pipe portion 640c of the cooling pipes 640, a portion of the base 636 of the uniaxial movement stage 635, and a portion of the movable plate 637 from the pulsed laser beam. Thereby, the beam adjusting apparatus 630 is capable of suppressing constituent elements, such as the spiral pipe portion 640c which are formed employing resin materials, from being exposed to scattered light of the pulsed laser beam. The other constituent elements may be the same as those of the configurations illustrated in FIG. 12 through FIG. 16.

10. Seventh Embodiment

Figure 19:
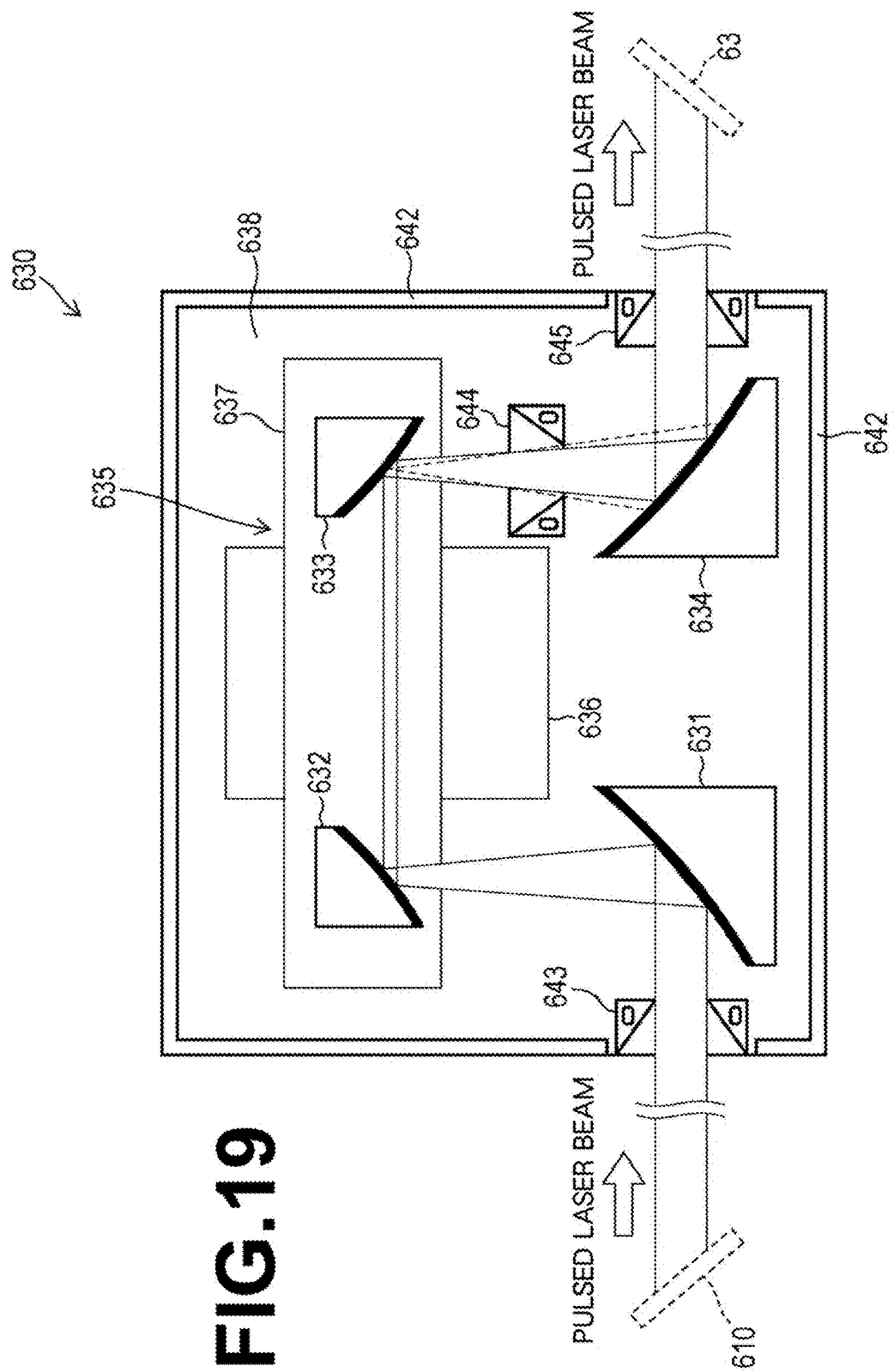
FIG. 19 is a diagram that illustrates an example of the configuration of a beam adjusting apparatus of a seventh embodiment.

When adjusting the diverging angle and the optical path of a pulsed laser beam in the beam adjusting apparatus 630, the pulsed laser beam which is reflected by convex mirrors such as the off axis parabolic convex mirror 633 may diffuse and leak to the exterior. For example, the pulsed laser beam which is reflected by the off axis parabolic convex mirror 633 may diffuse and the beam diameter thereof may become greater than a reflective surface 634a of the off axis parabolic concave mirror 634, which is provided downstream from the off axis parabolic convex mirror 633. The pulsed laser beam having a beam diameter which is greater than the reflective surface 634a will not be effectively reflected by the reflective surface 634a, may enter the constituent elements of the beam adjusting apparatus 630, may become scattered, and may leak to the exterior as scattered light. For this reason, a frame 642 may be provided with respect to the base plate 638 as illustrated in FIG. 19, for the purpose of suppressing leakage of scattered light to the exterior. Another purpose of providing the frame 642 may be to improve the rigidity of the base plate 638. However, if the pulsed laser beam which is not reflected by the reflective surface 634a enters the constituent elements of the beam adjusting apparatus 630 such as the frame 642, the constituent elements of the beam adjusting apparatus 630 may become heated and undergo thermal deformation. As a result, the positions and orientations of the off axis parabolic mirrors 631 through 634 may become shifted in the beam adjusting apparatus 630. In this case, the diverging angle, the direction of the optical axis, and the beam diameter of an output pulsed laser beam may not become desired values, and the beam adjusting apparatus 630 may not be able to cause the pulsed laser beam to propagate in an appropriate manner.

The phenomenon of the pulsed laser beam diffusing as described above may also occur in a pulsed laser beam that enters the beam adjusting apparatus 630 and a pulsed laser beam which is output from the beam adjusting apparatus 630. For example, in the case that the distance from the high reflectance mirror 610 to the beam adjusting apparatus 630 is comparatively long, the phenomenon of the pulsed laser beam diffusing may occur in the pulsed laser beam that enters the beam adjusting apparatus 630 as well. In the case that the distance from the beam adjusting apparatus 630 to the high reflectance mirror 63 is comparatively long, the phenomenon of the pulsed laser beam diffusing may occur in the pulsed laser beam which is output from the beam adjusting apparatus 630 as well.

<Configuration>

FIG. 19 is a diagram that illustrates a beam adjusting apparatus 630 of a seventh embodiment. The bracket 639 and the cooling pipes 640 are omitted in FIG. 19 and the drawings thereafter. Hereinafter, descriptions will mainly be given of points of difference from the sixth embodiment. To achieve the aforementioned purpose, the beam adjusting apparatus 630 includes the frame 642, and may further include liquid cooled apertures 643 through 645. Each of the liquid cooled apertures 643 through 645 may be apertures that pass pulsed laser beams at desired beam apertures, while shielding excess portions of pulsed laser beams which have diffused to exceed the desired beam diameters. Each of the liquid cooled apertures 643 through 645 may be cooled by a liquid.

The liquid cooled apertures 643 through 645 may be provided along the optical path of the pulsed laser beam at optical paths where the aforementioned phenomenon of the pulsed laser beam diffusing is likely to occur. Specifically, the liquid cooled apertures 643 through 645 may be respectively provided along the optical path of a pulsed laser beam that enters the beam adjusting apparatus 630, the optical path of a pulsed laser beam which is reflected by the off axis parabolic convex mirror 633, and the optical path of a pulsed laser beam which is output from the beam adjusting apparatus 630. In other words, the liquid cooled apertures 643 through 645 may be respectively provided at the entrance opening for the pulsed laser beam of the beam adjusting apparatus 630, between the off axis parabolic convex mirror 633 and the off axis parabolic concave mirror 634, and at an output opening for the pulsed laser beam of the beam adjusting apparatus 630. The pulsed laser beam which is reflected by the off axis parabolic convex mirror 633 is likely to propagate while diffusing between the off axis parabolic convex mirror 633 and the off axis parabolic concave mirror 634, and therefore it is preferable for the liquid cooled aperture 644 to be provided therebetween.

The beam adjusting apparatus 630 may include at least one of the liquid cooled apertures 643 through 645. In this case, the degrees of priority for the apertures to be included in the beam adjusting apparatus 630 from among the liquid cooled apertures 643 through 645 may be in descending order from the liquid cooled aperture 643 provided at the most upstream side, the liquid cooled aperture 644, and the liquid cooled aperture 645 provided at the most downstream side. This is because excess portions of a pulsed laser beam which has diffused to exceed a desired beam diameter is less likely to occur if the beam adjusting apparatus 630 includes a liquid cooled aperture more toward the upstream side. In addition, the beam adjusting apparatus 630 may include a liquid cooled aperture provided between the off axis parabolic concave mirror 631 and the off axis parabolic convex mirror 632 and may include a liquid cooled aperture provided between the off axis parabolic convex mirror 632 and the off axis parabolic convex mirror 633.

Figure 20:
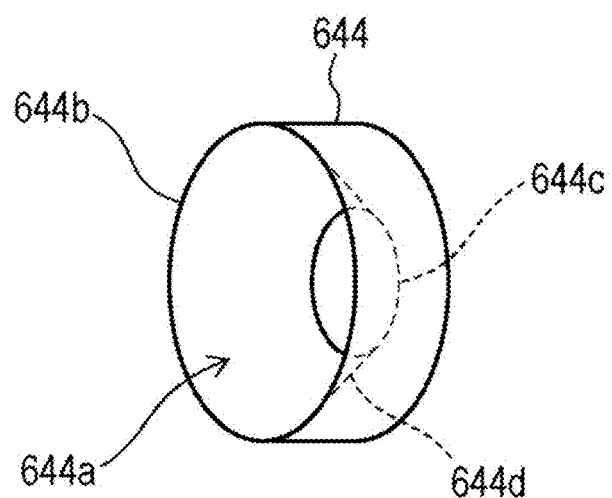
FIG. 20 is a diagram that schematically illustrates the outer appearance of a liquid cooled aperture illustrated in FIG. 19.
Figure 21:
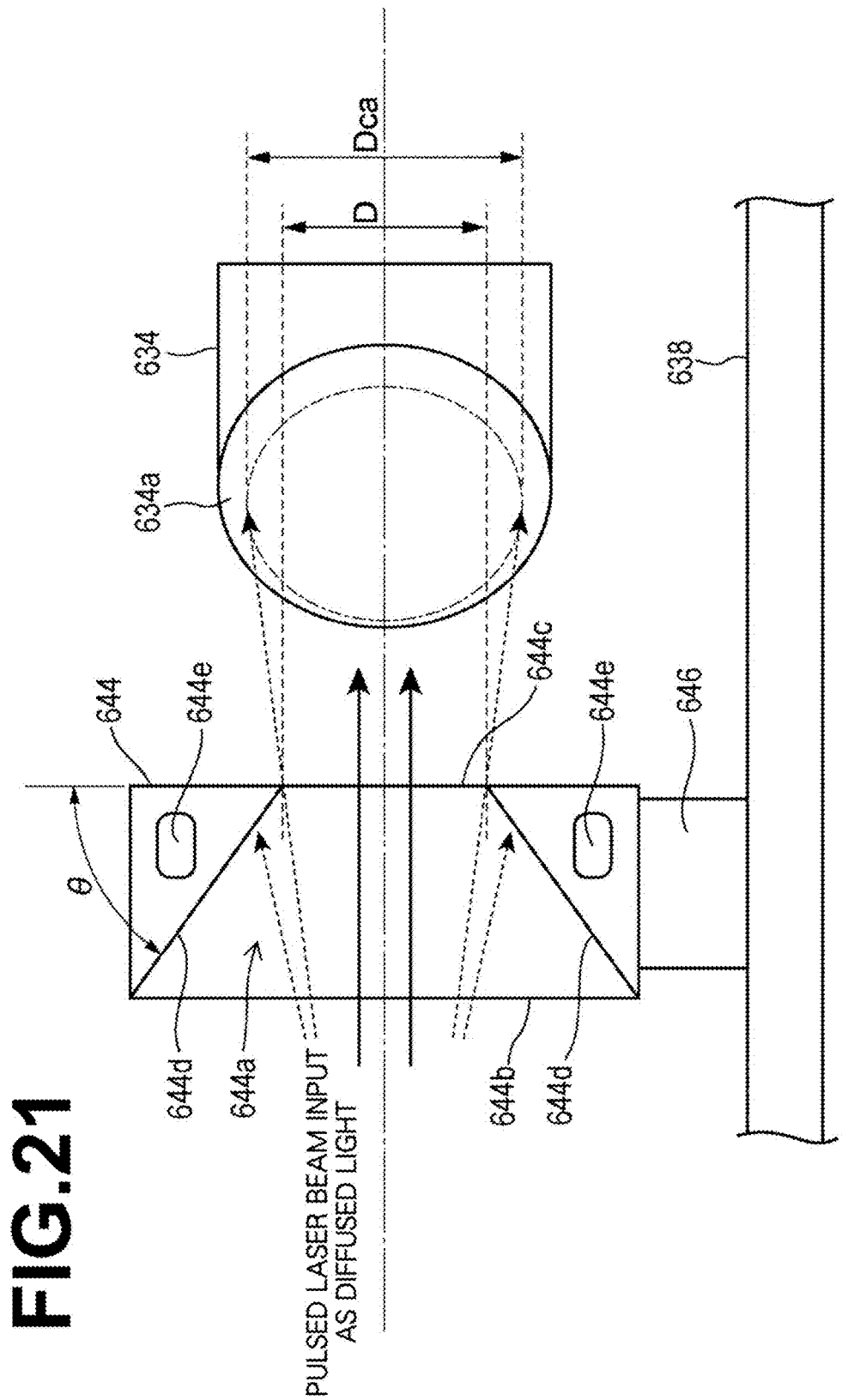
FIG. 21 is a diagram that illustrates an example of the configuration of the liquid cooled aperture illustrated in FIG. 19 in detail.

FIG. 20 is a diagram that schematically illustrates the outer appearance of the liquid cooled apertures 643 through 645 illustrated in FIG. 19. FIG. 21 is a diagram that illustrates an example of the configuration of the liquid cooled apertures 643 through 645 illustrated in FIG. 19 in detail. The liquid cooled apertures 643 through 645 may be substantially the same as each other. The outer shape and the configuration of the liquid cooled aperture 644 will be described as a representative example with reference to FIG. 20 and FIG. 21. The outer shape of the liquid cooled aperture 644 may be formed to be substantially cylindrical, as illustrated in FIG. 19. A penetrating aperture 644a may be formed in the liquid cooled aperture 644. The penetrating aperture 644a may include an input opening 644b, an output opening 644c, and a tapered surface 644d. The input opening 644b is an opening at one end of the penetrating aperture 644a, and may be an entrance through which a pulsed laser beam enters the liquid cooled aperture 644. The output opening 644c is an opening at the other end of the penetrating aperture 644a, and may be an exit through which the pulsed laser beam is output from the liquid cooled aperture 644. The input opening 644b and the output opening 644c may be formed to be of a shape corresponding to the cross sectional beam shape of the pulsed laser beam. For example, in the case that the cross sectional beam shape of the pulsed laser beam is substantially circular, the input opening 644b and the output opening 644c may be formed to be substantially circular. The diameter of the input opening 644b may be greater than the diameter D of the output opening 644c. The diameter D of the output opening 644c may be smaller than the diameter of the reflective surface 634a of the off axis parabolic concave mirror 634 positioned downstream from the liquid cooled aperture 644. The diameter D of the output opening 644c may be smaller than the diameter Dca of a clear aperture, which is the effective reflective area of the reflective surface 634a. The diameter D of the output opening 644c may be formed such that the beam diameter of the output pulsed laser beam at the reflective surface 634a will be the diameter Dca or less. Thereby, the liquid cooled aperture 644 may shield excess portions of the pulsed laser beam which has diffused and exceeds a desired beam diameter to become greater than the clear aperture of the off axis parabolic concave mirror 634, provided downstream from the liquid cooled aperture 344.

The tapered surface 644d may be a surface that receives excess portions of the pulsed laser beam which has diffused greatly beyond a desired beam diameter. The tapered surface 644d may be formed to be inclined with respect to the optical axis of the pulsed laser beam such that the power density of the pulsed laser beam that enters the tapered surface 644d is caused to decrease. The tapered surface 644d may be the inner peripheral surface of the penetrating aperture 644a, and may be formed such that the inner diameter thereof becomes smaller from the input opening 644b toward the output opening 644c. The tapered surface 644d may be formed such that the angle of inclination θ thereof with respect to a plane that substantially perpendicularly intersects the direction of the optical axis of the pulsed laser beam is 45 degrees or greater and 90 degrees or less. Preferably, the tapered surface 644d may be formed such that the angle of inclination θ is approximately 60 degrees.

In addition, a surface treatment that facilitates absorption of the pulsed laser beam may be administered at least on the tapered surface 644d, from among the surfaces of the liquid cooled aperture 644. The surface treatment that facilitates absorption of the pulsed laser beam may be a black alumite treatment, for example. In the case that a black alumite treatment is administered, the liquid cooled aperture 644 may be formed by aluminum.

In addition, a cooling medium channel 644e, through which a cooling medium such as cooling water flows, may be formed in the interior of the liquid cooled aperture 644. The cooling medium channel 644e may be formed along the outer circumferential direction of the tapered surface 644d. The cooling medium channel 644e may be connected to a cooling apparatus, which is not illustrated. When the excess portions of the pulsed laser beam which has diffused and exceeds a desired beam diameter enter the tapered surface 644d, heat may be generated in the liquid cooled aperture 644. The liquid cooled aperture 644 may be cooled by heat exchange with the cooling medium that flows within the cooling medium channel 644e. In the case that the beam adjusting apparatus 630 includes a plurality of liquid cooled apertures, the plurality of cooling medium channels which are formed in the plurality of liquid cooled apertures may be connected to each other in series. This is because it is sufficient for the cooling medium that flows through the plurality of cooling medium channels to suppress overheating of the plurality of liquid cooled apertures.

In addition, the liquid cooled aperture 644 may be fixed to the base plate 638 via a thermally insulating member 646. The thermally insulating member 646 may be formed by a ceramic, for example.

<Operation and Effects>

In the beam adjusting apparatus 630 of the present embodiment, each of the liquid cooled apertures 643 through 645 pass the pulsed laser beam therethrough at a desired beam diameter, and absorb excess portions of the pulsed laser beam which has diffused greatly beyond a desired beam diameter. For this reason, the beam adjusting apparatus 630 of the present embodiment is capable of suppressing heating and thermal deformation of constituent elements of the beam adjusting apparatus 630, such as the frame 642.

Further, in the beam adjusting apparatus 630 of the present embodiment, even if heat is generated in the liquid cooled apertures 643 through 645 due to absorption of the excess portions of the pulsed laser beam, the cooling medium that flows through the cooling medium channels which are formed in the respective liquid cooled apertures 643 through 645 discharge the generated heat. In addition, each of the liquid cooled apertures 643 through 645 is fixed to the base plat via the thermally insulating member 646 in the beam adjusting apparatus 630 of the present embodiment. Therefore, heat conduction from the liquid cooled apertures 643 through 645 to the base plate 638 can be suppressed. For this reason, the beam adjusting apparatus 630 of the present embodiment is capable of suppressing heating and thermal deformation of constituent elements of the beam adjusting apparatus 630, such as the frame 642.

Accordingly, the beam adjusting apparatus 630 of the present embodiment is capable of suppressing shifts in the positions and orientations of the off axis parabolic mirrors 631 through 634, and can adjust the diverging angle, the direction of the optical axis, and the beam diameter of an output pulsed laser beam with high precision. The beam adjusting apparatus 630 of the present embodiment is capable of causing the pulsed laser beam to propagate in a more appropriate manner.

<Modifications>

Figure 22:
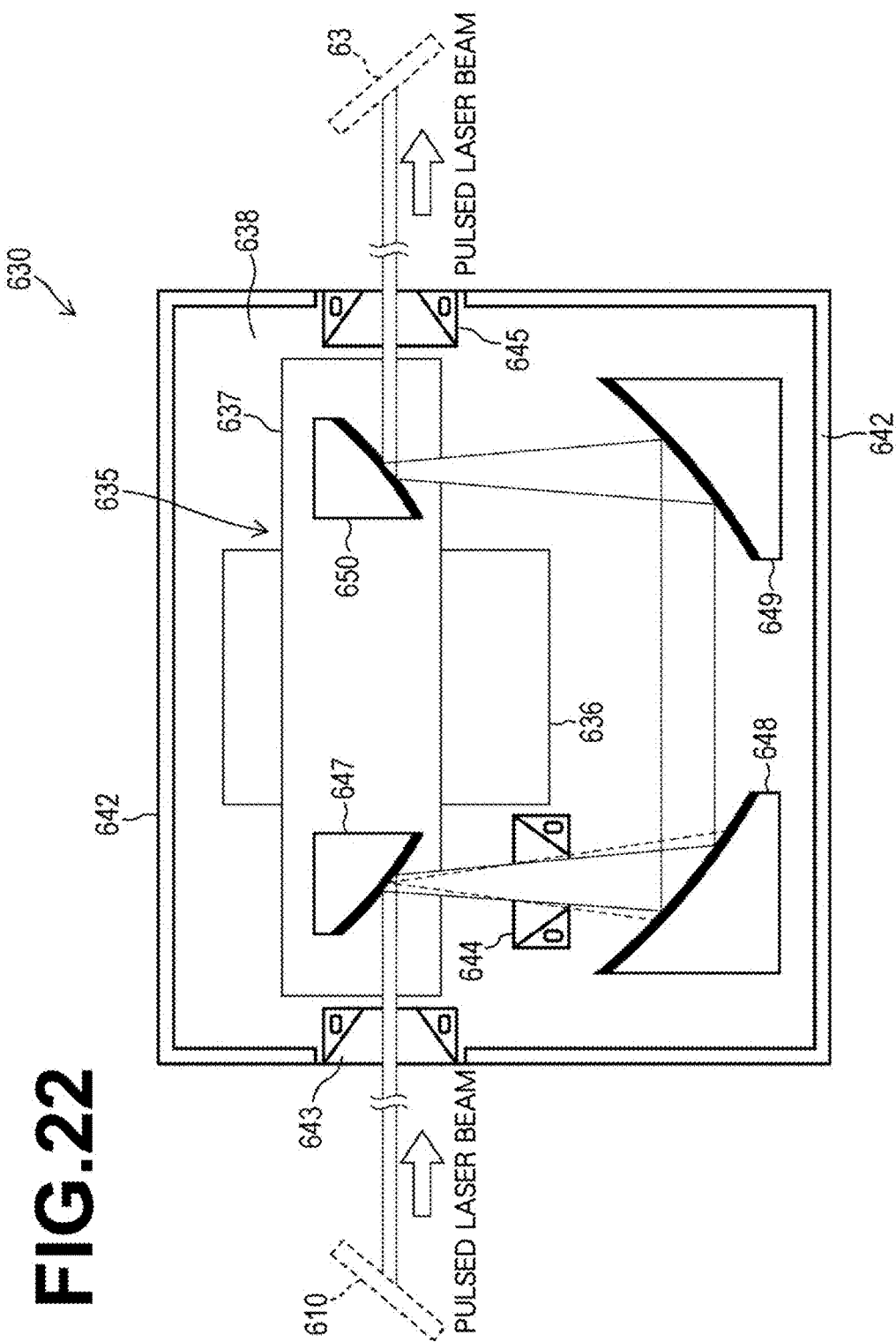
FIG. 22 is a diagram that illustrates a first modification of the beam adjusting apparatus of the seventh embodiment.

FIG. 22 is a diagram that illustrates a first modification of the beam adjusting apparatus 630 of the seventh embodiment. The order of arrangement of the off axis parabolic concave mirrors and the off axis parabolic convex mirrors in the beam adjusting apparatus 630 may be reversed from that of the configuration illustrated in FIG. 19.

Specifically, the beam adjusting apparatus 630 may include off axis parabolic convex mirrors 647 and 650 and off axis parabolic concave mirrors 648 and 649. The off axis parabolic convex mirror 647, the off axis parabolic concave mirror 648, the off axis parabolic concave mirror 649, and the off axis parabolic convex mirror 650 may be provided in this order along the optical path of a pulsed laser beam. The pulsed laser beam which is reflected by the off axis parabolic convex mirror 647 is likely to propagate while diffusing between the off axis parabolic convex mirror 647 and the off axis parabolic concave mirror 648, and therefore it is preferable for the liquid cooled aperture 644 to be provided therebetween. The other constituent elements of the beam adjusting apparatus 630 may be the same as those of the configurations illustrated in FIG. 19 through FIG. 21.

Figure 23:
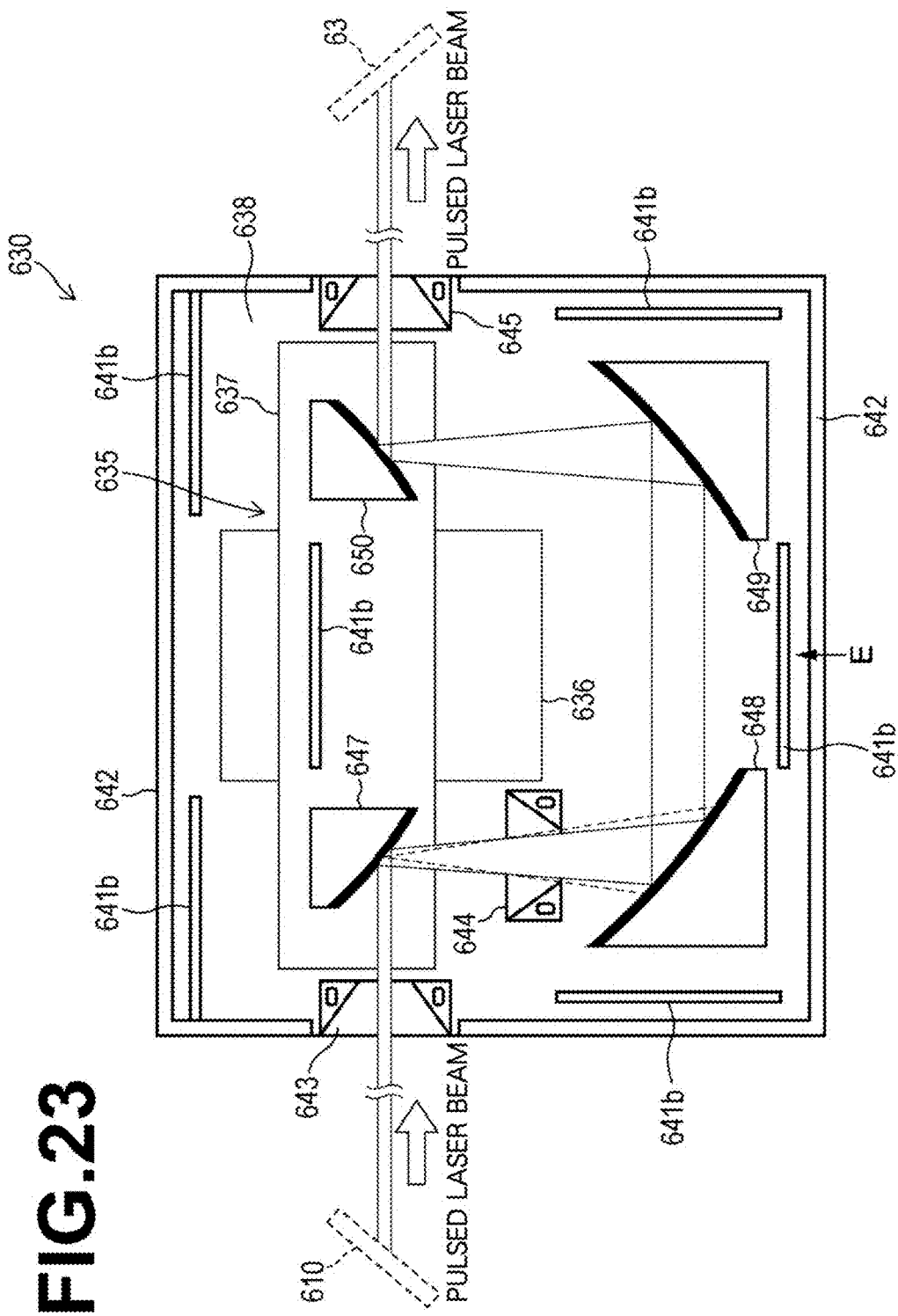
FIG. 23 is a diagram that illustrates a second modification of the beam adjusting apparatus of the seventh embodiment.

FIG. 23 is a diagram that illustrates a second modification of the beam adjusting apparatus 630 of the seventh embodiment. FIG. 24 is a diagram of a protective cover 641b as viewed from the direction of arrow E illustrated in FIG. 23. The beam adjusting apparatus 630 may include the protective cover 641b. The protective cover 641b may shield the frame 642 from the pulsed laser beam. The protective cover 641b may be provided between the optical path of the pulsed laser beam and the frame 642. A surface treatment that facilitates absorption of the pulsed laser beam may be administered on the surface of the protective cover 641b. The surface treatment that facilitates absorption of the pulsed laser beam may be a black alumite treatment, for example. In the case that a black alumite treatment is administered, the protective cover 641b may be formed by aluminum. The protective cover 641b may be fixed to the base plate 638 and the movable plate 637 via the thermally insulating member 646. Alternatively, the protective cover 641*b* may be fixed to the frame 642 via the thermally insulating member 646. Thereby, the beam adjusting apparatus 630 can further suppress heat generation at the frame 642 due to unpredictable scattered light of the pulsed laser beam, radiant light from plasma, and light reflected by the target 27 entering the frame 642. The other constituent elements may be the same as those of the configuration illustrated in FIG. 22.

The description above is intended to be illustrative and the present disclosure is not limited thereto. Therefore, it would be obvious to those skilled in the art that various modifications to the embodiments of the present disclosure would be possible as long as they do not stray from the spirit and the scope of the appended claims.

A portion of the configuration of certain embodiments may be substituted by configuration of other embodiments. Configurations of certain embodiments may be added to the configurations of other embodiments. A portion of the configuration of each of the embodiments may be omitted, other configurations may be added, or other configurations may be provided as substitutes.

The terms which are employed in the present specification and the appended claims are to be interpreted as "no limiting". For example, the terms "include" and "including" are to be interpreted to mean "including the described elements but not limited thereto". The term "have" is to be interpreted to mean "having the described elements but not limited thereto". Further, the indefinite articles "a" and "an", as well as the word "one" in the present specification as well as the appended claims are to be interpreted to mean "at least one" or "one or more".

What is claimed is:

1. An extreme ultraviolet light generating apparatus that irradiates a target with a pulsed laser beam output from a laser apparatus along an optical path to generate plasma, thereby generating extreme ultraviolet light, comprising:
    a chamber;
    a target supply unit configured to output the target into the chamber; and
    a beam adjusting apparatus configured to adjust beam parameters, provided along the optical path of the pulsed laser beam which is irradiated onto the target;
    the beam adjusting apparatus comprising:
    a first pair of mirrors constituted by a first concave mirror and a first convex mirror, provided along the optical path of the pulsed laser beam;
    a second pair of mirrors constituted by a second concave mirror and a second convex mirror, which are arranged in an order reversed from an order of arrangement of the first concave mirror and the first convex mirror, provided along the optical path of the pulsed laser beam downstream from the first pair of mirrors; and
    a moving apparatus configured to simultaneously increase or simultaneously decrease a distance between the first concave mirror and the first convex mirror and a distance between the second concave mirror and the second convex mirror, wherein:
    the first concave mirror and the second concave mirror are off axis parabolic concave mirrors,
    the first convex mirror and the second convex mirror are off axis parabolic convex mirrors,
    focal points of the second concave mirror and the second convex mirror match when focal points of the first concave mirror and the first convex mirror match,
    an incident angle and an output angle of the pulsed laser beam with respect to each of the first concave mirror, the second concave mirror, the first convex mirror, and the second concave mirror are 45 degrees, respectively, and
    the moving apparatus includes a movable plate to which a downstream side mirror of the first pair of mirrors and an upstream side mirror of the second pair of mirrors are fixed, and moves the movable plate along an optical axis of the pulsed laser beam at the first pair of mirrors and the second pair of mirrors.

2. The extreme ultraviolet light generating apparatus as defined in claim 1, wherein:
    the first concave mirror and the second concave mirror have reflective surfaces which are represented by a same function; and
    the first convex mirror and the second convex mirror have reflective surfaces which are represented by a same function.

3. The extreme ultraviolet light generating apparatus as defined in claim 1, wherein:
    at least one of a pair of the first concave mirror and the second concave mirror and a pair of the first convex mirror and the second convex mirror is a pair of spherical mirrors; and
    an angle formed by the incident optical axis and the output optical axis of the pulsed laser light with respect to the spherical mirrors is less than 45 degrees.

4. The extreme ultraviolet light generating apparatus as defined in claim 1, further comprising:
    a second beam adjusting apparatus provided upstream from an amplifier within the laser apparatus, the second beam adjusting apparatus comprising:
    a third pair of mirrors constituted by a third concave mirror and a third convex mirror, provided along the optical path of the pulsed laser beam;
    a fourth pair of mirrors constituted by a fourth concave mirror and a fourth convex mirror, which are arranged in an order reversed from an order of arrangement of the third concave mirror and the third convex mirror, provided along the optical path of the pulsed laser beam downstream from the third pair of mirrors; and
    a second moving apparatus configured to change a distance between the third concave mirror and the third convex mirror and a distance between the fourth concave mirror and the fourth convex mirror such that these distances simultaneously increase or simultaneously decrease,
    the first convex mirror being an upstream side mirror and the first concave mirror being a downstream side mirror, in the first pair of mirrors; and
    the third concave mirror being an upstream side mirror and the third convex mirror being a downstream side mirror, in the third pair of mirrors.

5. An extreme ultraviolet light generating apparatus that irradiates a target with a pulsed laser beam output from a laser apparatus to generate plasma, thereby generating extreme ultraviolet light, comprising:
    a chamber;
    a target supply unit configured to output the target into the chamber; and
    a beam adjusting apparatus configured to adjust beam parameters, provided along an optical path of the pulsed laser beam which is irradiated onto the target;
    the beam adjusting apparatus comprising:
    a first pair of mirrors constituted by a first concave mirror and a first convex mirror, provided along the optical path of the pulsed laser beam;

a second pair of mirrors constituted by a second concave mirror and a second convex mirror, which are arranged in an order reversed from an order of arrangement of the first concave mirror and the first convex mirror, provided along the optical path of the pulsed laser beam downstream from the first pair of mirrors; and a moving apparatus configured to simultaneously increase or simultaneously decrease a distance between the first concave mirror and the first convex mirror and a distance between the second concave mirror and the second convex mirror, wherein the moving apparatus includes a movable plate to which a downstream side mirror of the first pair of mirrors and an upstream side mirror of the second pair of mirrors are fixed, and moves the movable plate along an optical axis of the pulsed laser beam at the first pair of mirrors and the second pair of mirrors.

6. The extreme ultraviolet light generating apparatus as defined in claim 5, wherein:

the moving apparatus moves the downstream side mirror of the first pair of mirrors along the optical axis of the pulsed laser beam, and moves the upstream side mirror of the second pair of mirrors along the optical axis of the pulsed laser beam.

7. The extreme ultraviolet light generating apparatus as defined in claim 5, wherein:

the first concave mirror and the second concave mirror are off axis parabolic concave mirrors;

the first convex mirror and the second convex mirror are off axis parabolic convex mirrors; and focal points of the second concave mirror and the second convex mirror match when focal points of the first concave mirror and the first convex mirror match.

8. The extreme ultraviolet light generating apparatus as defined in claim 5, wherein:

an incident angle and an output angle of the pulsed laser beam with respect to each of the first concave mirror, the second concave mirror, the first convex mirror, and the second concave mirror are 45 degrees, respectively.

9. The extreme ultraviolet light generating apparatus as defined in claim 5, wherein:

the first concave mirror and the second concave mirror have reflective surfaces which are represented by a same function; and the first convex mirror and the second convex mirror have reflective surfaces which are represented by a same function.

10. The extreme ultraviolet light generating apparatus as defined in claim 5, wherein:

at least one of a pair of the first concave mirror and the second concave mirror and a pair of the first convex mirror and the second convex mirror is a pair of spherical mirrors; and an angle formed by the incident optical axis and the output optical axis of the pulsed laser light with respect to the spherical mirrors is less than 45 degrees.

11. The extreme ultraviolet light generating apparatus as defined in claim 5, further comprising:

a second beam adjusting apparatus provided upstream from an amplifier within the laser apparatus, the second beam adjusting apparatus comprising:

a third pair of mirrors constituted by a third concave mirror and a third convex mirror, provided along the optical path of the pulsed laser beam;

a fourth pair of mirrors constituted by a fourth concave mirror and a fourth convex mirror, which are arranged in an order reversed from an order of arrangement of the third concave mirror and the third convex mirror, provided along the optical path of the pulsed laser beam downstream from the third pair of mirrors; and a second moving apparatus configured to change a distance between the third concave mirror and the third convex mirror and a distance between the fourth concave mirror and the fourth convex mirror such that these distances simultaneously increase or simultaneously decrease, the first convex mirror being an upstream side mirror and the first concave mirror being a downstream side mirror, in the first pair of mirrors; and the third concave mirror being an upstream side mirror and the third convex mirror being a downstream side mirror, in the third pair of mirrors.

* * * * *